United States Patent
Tamaura

(10) Patent No.: US 10,008,977 B2
(45) Date of Patent: Jun. 26, 2018

(54) HELIOSTAT APPARATUS AND SOLAR HEAT COLLECTING APPARATUS AND CONCENTRATING PHOTOVOLTAIC APPARATUS

(71) Applicants: MIHAMA CORPORATION, Tokyo (JP); SOLARFLAME CORPORATION, Tokyo (JP)

(72) Inventor: Yutaka Tamaura, Tokyo (JP)

(73) Assignees: SOLARFLAME CORPORATION, Tokyo (JP); MIHAMA CORPORATION, Tokyo (JP)

( * ) Notice: Subject to any disclaimer, the term of this patent is extended or adjusted under 35 U.S.C. 154(b) by 145 days.

(21) Appl. No.: 15/021,163

(22) PCT Filed: Sep. 10, 2014

(86) PCT No.: PCT/JP2014/004645
§ 371 (c)(1),
(2) Date: Mar. 10, 2016

(87) PCT Pub. No.: WO2015/037230
PCT Pub. Date: Mar. 19, 2015

(65) Prior Publication Data
US 2016/0226437 A1    Aug. 4, 2016

(30) Foreign Application Priority Data

Sep. 10, 2013 (JP) .................................. 2013-187393
Nov. 18, 2013 (JP) .................................. 2013-237742
(Continued)

(51) Int. Cl.
*H02S 40/22* (2014.01)
*F24J 2/16* (2006.01)
(Continued)

(52) U.S. Cl.
CPC ............... *H02S 40/22* (2014.12); *F24J 2/16* (2013.01); *F24J 2/18* (2013.01); *F24J 2/38* (2013.01);
(Continued)

(58) Field of Classification Search
CPC ....... H01L 31/00–31/078; Y02E 10/50–10/60; H02S 10/00–10/40;
(Continued)

(56) References Cited

U.S. PATENT DOCUMENTS 4,289,118 A    9/1981  Stark
4,317,031 A    2/1982  Findell
(Continued)

FOREIGN PATENT DOCUMENTS

CN        101122667 A      2/2008
DE    20 2009 017657 U1    4/2010
(Continued)

OTHER PUBLICATIONS

Mar. 27, 2017 Partial European Search Report issued in European Patent Application No. 14844674.3.
(Continued)

*Primary Examiner* — Bach T Dinh
(74) *Attorney, Agent, or Firm* — Oliff PLC

(57) ABSTRACT

A heliostat apparatus includes one mirror frame supporting a reflecting mirror; a pair of north-south rotational shafts to rotate the mirror frame in the north-south direction; an east-west rotational shaft to rotate the mirror frame in the east-west direction with the north-south direction as the rotational axis direction; a pair of arms projecting from the east-west rotational shaft to the east and west; an east-west rotational shaft support allowing east-west rotational shaft axial rotation; and the north-south rotational shafts positioned to face each other on the ends of the arms. The mirror
(Continued)

frame rotation, etc. as an integrated unit in the east-west direction with the east-west rotational shaft as the rotational axis adjusts a reflecting mirror reflecting surface east-west angle. With the north-south rotational shaft as the rotational axis, the mirror frame rotation in the north-south direction adjusts the north-south angle of at least one reflecting mirror reflecting surface.

19 Claims, 23 Drawing Sheets

(30) Foreign Application Priority Data

| Jul. 3, 2014 | (JP) | ................................. | 2014-137635 |
| Jul. 11, 2014 | (JP) | ................................. | 2014-143387 |

(51) Int. Cl.

| F24J 2/38 | (2014.01) |
| F24J 2/54 | (2006.01) |
| G05D 3/10 | (2006.01) |
| H02S 20/32 | (2014.01) |
| H01L 31/054 | (2014.01) |
| H02S 40/38 | (2014.01) |
| H02S 40/42 | (2014.01) |
| G01S 3/786 | (2006.01) |
| G02B 7/183 | (2006.01) |
| G02B 19/00 | (2006.01) |
| G02B 26/08 | (2006.01) |
| F24J 2/18 | (2006.01) |
| F24J 2/10 | (2006.01) |
| F24J 2/07 | (2006.01) |

(52) U.S. Cl.
CPC ........... *F24J 2/5424* (2013.01); *G01S 3/7861* (2013.01); *G02B 7/183* (2013.01); *G02B 19/0019* (2013.01); *G02B 19/0042* (2013.01); *G02B 26/0816* (2013.01); *G05D 3/105* (2013.01); *H01L 31/0547* (2014.12); *H02S 20/32* (2014.12); *H02S 40/38* (2014.12); *H02S 40/42* (2014.12); *F24J 2002/075* (2013.01); *F24J 2002/108* (2013.01); *F24J 2002/5458* (2013.01); *Y02E 10/47* (2013.01); *Y02E 10/52* (2013.01)

(58) Field of Classification Search
CPC ......... H02S 20/00–20/32; H02S 30/00–30/20; H02S 40/00–40/40; H02S 50/00–50/15; F24J 2/54–2/5431; F24J 2002/5434–2002/5496

USPC .................................................. 136/243–265
See application file for complete search history.

(56) References Cited

U.S. PATENT DOCUMENTS

| 4,602,613 | A | | 7/1986 | Barr | |
| 4,602,853 | A | | 7/1986 | Barr | |
| 6,051,776 | A | * | 4/2000 | Kimata | .................. H01L 31/052 |
| | | | | | 126/624 |
| 6,384,320 | B1 | | 5/2002 | Chen | |
| 2008/0011288 | A1 | * | 1/2008 | Olsson | .................. E04D 13/033 |
| | | | | | 126/576 |
| 2010/0031991 | A1 | * | 2/2010 | Mochizuki | .............. H01L 35/30 |
| | | | | | 136/206 |
| 2010/0170560 | A1 | | 7/2010 | Sapienza et al. | |
| 2010/0180883 | A1 | | 7/2010 | Oosting | |
| 2010/0229852 | A1 | | 9/2010 | Buckley | |
| 2010/0263709 | A1 | * | 10/2010 | Norman | ..................... F24J 2/07 |
| | | | | | 136/246 |
| 2011/0043433 | A1 | | 2/2011 | Klien | |
| 2011/0232631 | A1 | | 9/2011 | Bohmer | |
| 2011/0303214 | A1 | | 12/2011 | Welle | |
| 2012/0182635 | A1 | * | 7/2012 | Lee | ............. F24J 2/16 |
| | | | | | 359/853 |
| 2013/0008489 | A1 | | 1/2013 | Luo | |
| 2013/0175420 | A1 | | 7/2013 | Dror | |
| 2015/0040964 | A1 | | 2/2015 | Matalon | |

FOREIGN PATENT DOCUMENTS

| DE | 20 2011 101726 U1 | 10/2011 |
| EP | 1 995 790 A2 | 11/2008 |
| EP | 2 051 023 A1 | 4/2009 |
| GB | 751050 A | 6/1956 |
| GB | 1581253 A | 12/1980 |
| JP | 2012063086 A | 3/2012 |
| JP | 2012253146 A | 12/2012 |
| JP | 2013019640 A | 1/2013 |
| WO | 2010005014 A1 | 1/2010 |
| WO | 2011055719 A1 | 5/2011 |
| WO | 2012042888 A1 | 4/2012 |
| WO | 2013/002027 A1 | 1/2013 |
| WO | 2013128236 A1 | 9/2013 |

OTHER PUBLICATIONS

Dec. 9, 2014 Search Report issued in International Patent Application No. PCT/JP2014/004645.
Sep. 12, 2017 European Search Report issued in European Patent Application No. 14844674.3.
Sep. 5, 2017 Office Action issued in Japanese Application No. 2013-187393.

* cited by examiner

40

60

6 1

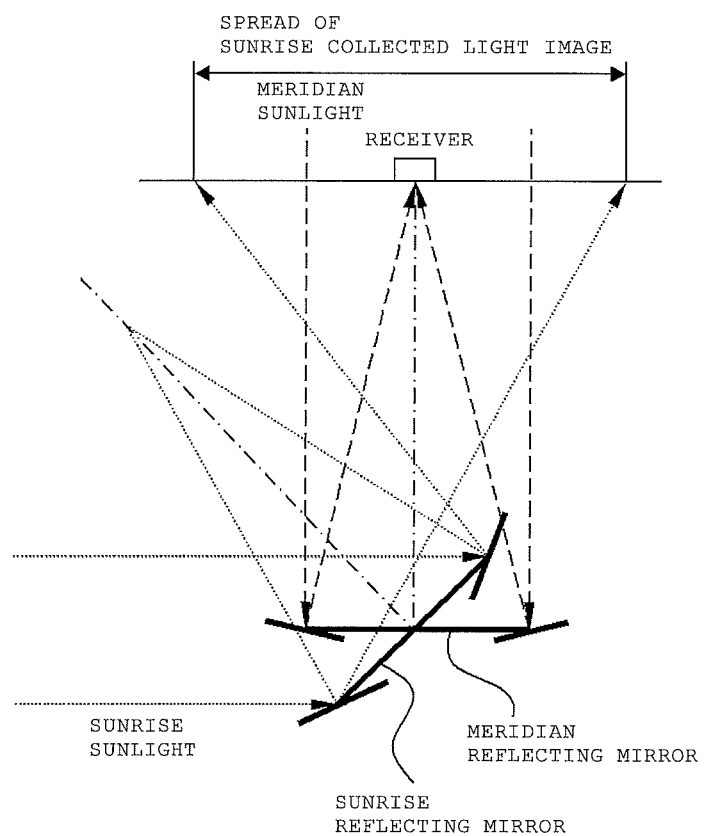

HELIOSTAT APPARATUS AND SOLAR HEAT COLLECTING APPARATUS AND CONCENTRATING PHOTOVOLTAIC APPARATUS

TECHNICAL FIELD

The present invention relates to a heliostat apparatus, a solar heat collecting apparatus, and a concentrating photovoltaic apparatus using reflecting mirrors that reflect sunlight in the desired direction to collect light.

BACKGROUND ART

Energy has traditionally been produced from petroleum and other fossil fuels, but in recent years, concerns have emerged regarding the depletion of fossil fuels, emissions of greenhouse gases such as carbon dioxide from the use of fossil fuels, and rising fuel costs.

Sunlight, which is renewable and involves no fuel costs, has been gathering attention as a new energy source.

There are a number of different solar heat collecting apparatuses that use sunlight as their energy source, which can be differentiated by the system of sunlight collection (See Patent Literature 1). Among these, for example, are the parabolic trough type and the linear Fresnel type heat collectors, as well as the tower type heat collector.

The parabolic trough heat type collector consists of a trough-shaped parabolic mirror used to reflect sunlight and collect it in the receiver to collect solar heat.

The linear Fresnel type heat collector consists of plural reflecting mirrors installed on plural parallel reflection lines laid out in the north-south direction, and a receiver installed over the mirrors in a north-south oriented reception line to collect sunlight reflected from the mirrors and thereby collect solar heat.

The tower type heat collector uses plural reflecting mirrors installed around a tower to collect sunlight and thereby collect solar heat in the receiver on the tower.

CITATION LIST

Patent Literature

Patent Literature 1: Japanese Unexamined Patent Publication (Kokai) No. 2012-63086.

SUMMARY OF THE INVENTION

Technical Problem

In addition to the types of solar heat collecting apparatus listed above, there is also the cross linear type.

The cross linear type solar heat collector is comprised of plural reflection lines arranged in parallel in a north-south direction, on each of which are installed plural reflecting mirrors, and a reception line with a receiver arranged orthogonal to the reflection lines (in an east-west direction) installed above the reflecting mirrors to collect the light of the sun reflected by the reflecting mirrors in order to collect solar heat.

With this cross linear type of apparatus, an apparatus such as that depicted in FIG. 11, for example, is used to adjust the angle of the reflecting surface of a reflecting mirror in order to collect the reflected sunlight in the receiver. FIG. 11 shows a top view of a conventional heliostat.

The heliostat apparatus 101 in FIG. 11 is comprised of two mirror frames 103, 104 supporting one reflecting mirror 102, with the mirror frame 104 enclosing the mirror frame 103. The mirror frame 103 is connected to the mirror frame 104 such that it can rotate in a north-south direction with an east-west shaft 105 as its rotational axis. Further, the apparatus is constructed such that the mirror frame 104 can rotate in an east-west direction with a north-south shaft 106 as its rotational axis. By means of this structure, the reflecting mirror 102 rotates in the north-south and east-west directions, adjusting the angle of the reflecting surface.

However, with this type of conventional heliostat apparatus, at least 2 large mirror frames must enclose one reflecting mirror in order to adjust the reflecting surface angle, increasing the number of components and leading to cost issues, etc.

Bearing these problems in mind, the present invention aims to provide a lower-cost heliostat apparatus.

Solution to Problem

In order to achieve the goal described above, the present invention provides a heliostat apparatus that adjusts an angle of a reflecting surface of at least one reflecting mirror to follow the movement of the sun, the heliostat apparatus comprising: one mirror frame to support the at least one reflecting mirror; a pair of north-south rotational shafts whose rotational axial direction is the east-west direction for the purpose of rotating the mirror frame in the north-south direction, the pair of the north-south rotational shafts being connected to the mirror frame; an east-west rotational shaft whose rotational axial direction is the north-south direction for the purpose of rotating the mirror frame in the east-west direction; a pair of arms projecting from the east-west rotational shaft to the east and the west; and a support that supports the east-west rotational shaft and allows the axial rotation of the east-west rotational shaft, wherein, the pair of the north-south rotational shafts is rotatably positioned on the ends of the pair of the arms such that the north-south rotational shafts face each other; with the east-west rotational shaft as the rotational axis, the pair of the arms, the pair of the north-south rotational shafts, and the mirror frame are rotated as an integrated unit in the east-west direction, such that the angle of the reflecting surface of the at least one reflecting mirror supported by the mirror frame is adjusted in the east-west direction; and, with the pair of the north-south rotational shafts as the rotational axis, the mirror frame is rotated in the north-south direction such that the angle of the reflecting surface of the at least one reflecting mirror is adjusted in the north-south direction.

This sort of apparatus not only makes it possible to easily adjust a reflecting surface angle by rotating the reflecting mirror in the east-west and north-south directions, it also makes it possible to reduce the number of mirror frames to 1, as opposed to the conventional apparatus that requires 2. This makes it possible to reduce the number of components, reduce costs, and increase ease of transport.

It is also possible that the heliostat apparatus further comprises a motor that is connected to the east-west rotational shaft and controls the axial rotation of the east-west rotational shaft.

With this sort of apparatus, it is possible to use the motor to easily rotate the reflecting mirror in the east-west direction, using the pair of the arms, the pair of the north-south rotational shafts, and the mirror frame.

It is possible that the heliostat apparatus further comprises an east-west chain attached at the ends of the pair of the arms and an east-west chain length adjusting unit to which the east-west chain is hooked, wherein, by operation of the east-west chain length adjusting unit, the pair of the arms and the mirror frame are integrally rotated in the east-west direction with the east-west rotational shaft as the rotational axis, as a length of the east-west chain between the east-west chain length adjusting unit and the location of the arms at which the east-west chain is attached is adjusted.

This sort of apparatus makes it possible to easily rotate the reflecting mirror in the east-west direction using the arms, etc.

Further, because the tensile force of the east-west chain can hold the arms in place, it is possible to effectively limit shaking of the reflecting mirror caused by the wind. The negative effects of the wind on the collection of sunlight are therefore minimized, making it possible to improve light collection efficiency.

It is possible that the heliostat apparatus further comprises a north-south chain attached at the mirror frame from north to south, and a north-south chain length adjusting unit to which the north-south chain is hooked, wherein, by operation of the north-south chain length adjusting unit, the mirror frame are rotated in the north-south direction with the north-south rotational shafts as the rotational axis, as a length of the north-south chain between the north-south chain length adjusting unit and the location of the mirror frame at which the north-south chain is attached is adjusted.

This sort of apparatus makes it possible to easily rotate the reflecting mirror in the north-south direction using the arms, etc.

Further, because the tensile force of the north-south chain can hold the arms in pace, it is possible to effectively limit shaking of the reflecting mirror caused by the wind. The negative effects of the wind on the collection of sunlight are therefore minimized, making it possible to improve the light collection efficiency.

It is possible that the heliostat apparatus further comprises a structure in order to hold a shape of the mirror frame.

When the east-west chain is used as described above, the tensile force of the chain may, depending on the materials, cause bowing in the arms and the mirror frame. This is also true when the north-south chain is used.

With the structure noted above, it is possible to prevent deformation such as bowing, and thereby the tensile force of each chain can be sufficient to apply adequate strength to the east-west and north-south rotating mechanisms of the mirror frame, making it possible to further prevent wind-related shaking, and improve rotational stability and precision.

It is possible that the mirror frame has a quadrangular frame and a rear support member, and one reflecting mirror is positioned on each side of the quadrangular frame such that it is tilted toward the inside of the quadrangular frame, and the rear support member supports the back of the tilted reflecting mirrors.

With this sort of arrangement, it is possible to position four reflecting mirrors on one heliostat apparatus, making it possible to reflect sunlight over a broader range for sunlight collection. Moreover, as each reflecting mirror is tilted as described above, it is easy to adjust the four reflecting mirrors to a single focal point, and because they are supported by the rear support member, it is possible to suppress wind-related shaking. Accordingly, it is possible to improve light collection efficiency.

Further, for the same area for reflecting sunlight for light collection, it is more effective to use four reflecting mirrors as in the present invention, rather than use a single large conventional mirror, as the area of each reflecting mirror can be reduced, effectively making it easier to manufacture and transport. This makes it possible to reduce costs and increase ease of handling.

Because the weight of each mirror is reduced, it is possible to keep the mirrors from warping under their own weight. The negative effects of warping on light collection can be reduced, also contributing to improved light collection efficiency.

It is possible that the reflecting surface of each reflecting mirror is a Fresnel surface.

This can make it easier to reflect sunlight for light collection.

It is possible that each reflecting mirror has a base and plural reflecting mirror pieces with a flat shape fitted upon the base; the reflecting surface of each reflecting mirror is a mosaic surface made up of aggregate reflecting surfaces of the plural reflecting mirror pieces, and the reflected sunlight from the reflecting surface of each of the plural reflecting mirror pieces overlaps to form a focal point; and, the plural reflecting mirror pieces are mounted on mounting surfaces of the base and an angle of each mounting surface is adjusted such that the reflected sunlight from the reflecting surfaces of the plural reflecting mirror pieces fitted on the base is collected at the focal point.

With this sort of arrangement, it is possible to collect reflected sunlight more easily and properly in the desired area, even when the reflecting surface of the reflecting mirror is large.

In other words, because the reflecting surface is made up of plural flat-shaped mirror pieces, it will be easier to prepare than, for example, one concave mirror with a larger reflecting surface area. With regard to the focal point, it is possible to form a more uniform collected light image. When collecting reflected light in a photovoltaic cell to generate electricity, for example, a uniform collected light image contributes to stable generation of electricity and stable power supply.

It is possible that the focal point is polygonal in shape.

With a conventional reflecting mirror, i.e., a single large concave mirror, the focal point is circular in shape. The reflecting mirrors in the present invention are made up of plural mirror pieces, such that the focal point is polygonal in shape.

It is possible that each mounting surface is connected to an adjacent mounting surface by a step, and a step surface of the step that connects the adjacent mounting surfaces to each other has a hole that passes through the base.

With this sort of arrangement, wind blowing onto a reflecting mirror can pass to the opposite side of the reflecting mirror via the hole. This makes it possible to reduce wind resistance, preventing wind-related warping and shaking of the reflecting mirrors, and inhibiting losses in light collection efficiency. The weight of the base can also be reduced, making the reflecting mirrors easier to handle.

The present invention also provides a solar heat collecting apparatus, wherein the solar heat collecting apparatus includes one or more heliostat apparatuses described above, and the reflected sunlight from the at least one reflecting mirror supported by each heliostat apparatus, in which the angle of the reflecting surface is adjusted, is collected in a receiver to collect solar heat.

The present invention could also provide a concentrating photovoltaic apparatus, wherein the concentrating photovoltaic apparatus includes one or more heliostat apparatuses described above, and the reflected light of the sunlight from the at least one reflecting mirror supported by each heliostat apparatus, in which the angle of the reflecting surface is adjusted, is collected in a photovoltaic cell.

With a solar heat collecting apparatus or concentrating photovoltaic apparatus that uses the heliostat apparatus of the present invention, it is possible to use solar energy at a low cost, with high efficiency. The heliostat apparatus of the present invention can be used in such solar heat collecting apparatuses or concentrating photovoltaic apparatuses as the tower type or the cross linear type, etc.

It is possible that the photovoltaic cell is equipped with a heat exchanger.

With this sort of arrangement, it is possible to inhibit the loss of power generation efficiency related to temperature increases caused by light collection. The heat exchanger can also recover heat energy.

It is possible that the photovoltaic cell is equipped with a tubular secondary light collector to guide the reflected light that is collected by the at least one reflecting mirror to the photoreceiving surface of the photovoltaic cell.

With this sort of arrangement, the reflected light from the reflecting mirror is collected in the photovoltaic cell both directly and through the secondary light collector. This makes it possible to broaden the light collection range, and collect light in the photovoltaic cell more easily and efficiently.

It is possible that the heliostat apparatus is equipped with a light collection receiver supported by the mirror frame; the light collection receiver includes the photovoltaic cell and a sensor that senses the position of the sun from the sunlight and transmits a signal; and, based on the signal transmitted by the sensor, the angle of the reflecting surface of the at least one reflecting mirror can be automatically adjusted in the north-south and east-west directions to follow the movement of the sun by controlling the east-west rotation of the integrated unit including the pair of the arms, the pair of the north-south rotational shafts and the mirror frame, and controlling the north-south rotation of the mirror frame, powered by the photovoltaic cell.

Because the angle of the reflecting surface of a reflecting mirror can be automatically adjusted to follow the movement of the sun using the photovoltaic cell and the sensor, reflected sunlight can be collected in the photovoltaic cell extremely easily. The complex computer calculations required to follow the movement of the sun in conventional systems can be eliminated, reducing cost and inconvenience. This can be a self-contained system that does not require central controls.

It is possible that the heliostat apparatus is further equipped with an auxiliary storage battery or an auxiliary photovoltaic cell, and using power from the auxiliary storage battery or auxiliary photovoltaic cell, the reflecting surface of the at least one reflecting mirror can be automatically adjusted to face the east after nightfall before the following sunrise by rotating the integrated unit including the pair of the arms, the pair of the north-south rotational shafts, and the mirror frame from west to east.

With this sort of arrangement, it is possible to automatically prepare the system to follow the movement of the sun with the sensor the next morning, making it easy to use. This makes it possible for the system to be fully self-contained.

It is possible that the concentrating photovoltaic apparatus includes a reflection line and one or more receivers; the reflection line is arranged in a north-south direction; plural reflecting mirrors to reflect sunlight are installed in series on the reflection line; the plural reflecting mirrors are provided with a heliostat mechanism to adjust the angle of the reflecting surface of the plural reflecting mirrors to follow the movement of the sun; the heliostat mechanism includes an east-west angle adjustment unit to be capable of adjusting the angle of the reflecting surface of the plural reflecting mirrors in the east-west direction, and a north-south angle adjustment unit to be capable of separately adjusting the angle of the reflecting surface of the plural reflecting mirrors in the north-south direction; the one or more receivers are each equipped with a receiver rotation mechanism that rotates the receiver to follow the movement of the sun in an east-west arc with the reflection line as the central axis; and, the receiver is equipped with a photovoltaic cell, the photoreceiving surface of which collects the reflected sunlight from the plural reflecting mirrors.

There are other conventional systems besides solar heat collecting apparatuses as described above that use sunlight as an energy source, such as those with an arrangement of photovoltaic cells. An example of this sort of system is depicted in FIG. 35.

As depicted in FIG. 35, a solar cell panel connecting plural photovoltaic cells is arranged above ground. The size of the panel could be 2 m×2 m, for example. Direct exposure of the panel to sunlight generates electricity.

In the present invention, the photoreceiving surface of a photovoltaic cell is exposed to sunlight collected by reflecting mirrors, so unlike the apparatus depicted in FIG. 35, it is possible to reduce the number and area of the photovoltaic cells, as well as the ground area, thereby making it possible to save on land and device wiring costs, etc. With plural reflecting mirrors collecting light in a photovoltaic cell rather than several panels of photovoltaic cells, the number and area of the cells themselves are greatly reduced, making dramatic cost savings possible.

The large photovoltaic cell area of the apparatus depicted in FIG. 35 makes the panel heavy, and it is difficult to adjust the angle of the large area panel to follow the movement of the sun.

With the present invention, the area of the photovoltaic cell in the light collecting receiver can be reduced, and it is only necessary to simply rotate the receiver and adjust the angle of the reflecting surface of the reflecting mirrors.

Further, the intensity distribution of the collected light differs from that of conventional light collecting methods such as towers, etc., depicted in FIG. 32, in that with the present invention, it is possible to minimize sunlight collection aberration throughout the day, at any time of day. Image blurring and distortion are also inhibited, so that compared with conventional systems in which the collected light is intense only around the center, the collected light is intense over a wider area, as shown in FIG. 31, and more uniform light collection is possible. There is no fanning out, as seen in conventional systems, and high degrees of light collection are seen in other areas besides the center, preventing energy loss and making it possible to efficiently and steadily collect light throughout the day.

Further, compared with an apparatus such as that depicted in FIG. 35, which has a fixed panel surface angle, light collection efficiency can be increased with the present invention, in which the angle of the reflecting surface of the reflecting mirrors and the rotational angle of the receiver follow the movement of the sun.

FIG. 34 shows the changes in the degree of light collection using a light collection method such as that of FIG. 35 over the course of the day. FIG. 33 shows the changes in the degree of light collection using the light collection method of the present invention. As shown by these diagrams, when using conventional methods the degree of light collection is unstable throughout the day, being particularly low in the morning and evening. With the present invention, a high degree of light collection can be achieved even in the morning and evening, and uniformly maintained throughout the day. As a result, with the present invention it is possible to collect 1.5 times the light energy of conventional methods in the photovoltaic cell per day. This makes it possible to reduce the land area needed to install the apparatus, and makes it possible to generate sufficiently high amounts of electricity even in relatively small countries, such as Japan.

Conventional cross linear type light collection methods offer improvements in light collection efficiency compared with other light collection methods, but because the receiver is in a fixed position, collected light image blurring and spreading still occur when collecting light in the receiver (photovoltaic cell) in the morning and evening in particular, and at high latitudes. The amount of light energy collected under those conditions is reduced, and the amount of light energy that can be collected over the course of the day is not stable.

With the present invention, both the angle of the reflecting surface of the reflecting mirrors and the east-west rotational angle of the receiver are adjusted, making it possible to reduce the sort of blurring described above throughout the day. In this way, it is possible to efficiently collect light throughout the day in a stable and uniform manner, and thus collect more light energy.

Moreover, because the photovoltaic cell on the receiver can be used to generate electricity, the turbines, etc. required by conventional solar heat collecting apparatuses, etc. become unnecessary. This further enhances the effectiveness of the present invention, as the turbines themselves, the land area needed to install them, and the costs associated with the land are eliminated.

Because there is an east-west angle adjustment unit and a north-south angle adjustment unit, and the controls for adjusting the angle of the reflecting surface of the reflecting mirrors are separated into a control for adjusting the east-west angle and a control for adjusting the north-south angle, it is possible to simplify the controls and greatly increase accuracy. In other words, it is possible to simply adjust reflecting surface angles at low cost and with great accuracy. This makes it easier to reflect sunlight into the receiver at an appropriate angle, improving both light collection efficiency and electricity generation efficiency.

It is possible that the east-west angle adjustment unit and the receiver rotation mechanism adjust the angle of the reflecting surface of the plural reflecting mirrors in the east-west direction, and the rotational angle of the rotating receiver in the east-west direction, respectively, in order to match the azimuth angle of the sun.

With this sort of arrangement, it is possible to further increase light collection efficiency by adjusting the east-west angle such that the reflecting surface of the reflecting mirrors is perpendicular to the rays of the sun, and having the light reflect from the reflecting mirrors to the receiver at an angle that is perpendicular to the receiver as well.

Advantageous Effects of Invention

The present invention provides a heliostat apparatus that makes it possible to reduce the number of large mirror frames and the quantity of materials they require, lowering costs, improving ease of handling and transportation, and allowing for easy adjustment of reflecting angle surfaces.

The present invention also provides a solar heat collecting apparatus and a concentrating photovoltaic apparatus that make possible stable heat collection and electricity generation.

Sunlight can also be collected in photovoltaic cells to generate electricity with high efficiency, and at low cost and great accuracy.

BRIEF DESCRIPTION OF DRAWINGS

FIG. 38 is an explanatory diagram of the collected light image when the receiver is in a fixed position.

EMBODIMENT OF THE INVENTION

The following is a description of an embodiment of the present invention, but the present invention is not limited to this embodiment.

Figure 1:
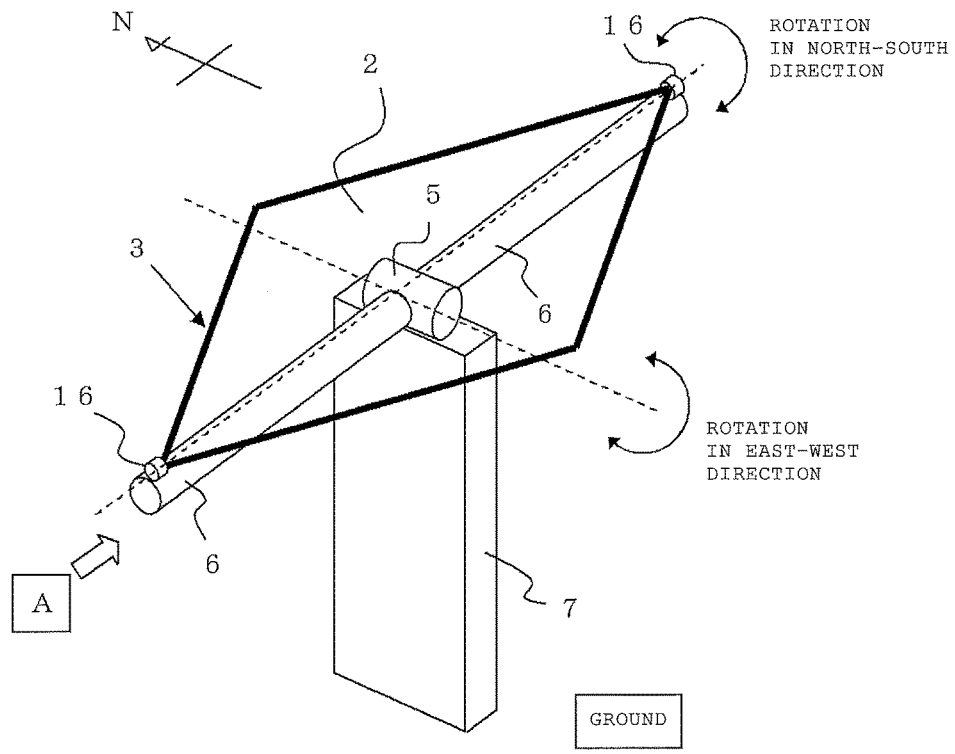
FIG. 1 is an explanatory diagram of an example of a heliostat apparatus of the present invention.

FIG. 1 depicts an example of a heliostat apparatus of the present invention.

The overall structure of the heliostat apparatus is described as follows. The primary components are one mirror frame 3 that supports reflecting mirror 2, a pair of north-south rotational shafts 16, an east-west rotational shaft 5, a pair of arms 6, and a support 7. Regarding the number of reflecting mirrors 2 that can be attached, there should be at least one, and while it is possible to have plural mirrors, for the purposes of this description, this example will have one reflecting mirror. Also, in order to easily describe the structure of the heliostat apparatus 1, the reflecting mirror 2 is depicted as being transparent in FIG. 1 and other diagrams.

Further, the reflecting mirror 2 can be made up of a base and plural reflecting mirror pieces as described below, but for ease of description, the specific structure of the reflecting mirror is, with the exception of FIGS. 26-30, omitted from the diagrams, which show only the overall outline of the reflecting mirror.

The east-west rotational shaft 5 is attached to the support 7 installed on the ground in such a way as to allow axial rotation. The direction of the rotational axis is north-south. Projecting from the east-west rotational shaft 5 to the east and to the west are each of a pair of arms 6. At the end of each arm 6 is a north-south rotational shaft 16, attached so that it can rotate and the two north-south rotational shafts 16 face each other. The pair of the north-south rotational shafts 16 are aligned along a rotational axis that is east-west in direction. The north-south rotational shafts 16 are connected to the mirror frame 3.

The angle of the reflecting surface of the reflecting mirror 2 is adjusted as follows.

For adjustment in the east-west direction, the arms 6, north-south rotational shafts 16, and mirror frame 3 are rotated as an integrated unit in the east-west direction, using the east-west rotational shaft 5 as the rotational axis, to adjust the angle of the reflecting mirror 2.

For adjustment in the north-south direction, the mirror frame 3 is rotated in the north-south direction using the pair of the north-south rotational shafts 16 as the rotational axis to adjust the angle of the reflecting mirror 2.

The following is a further detailed explanation.
(Rotation in the East-West Direction)

The east-west rotational shaft 5 is attached to the support 7 such that its rotational axis is oriented in the north-south direction. There is no particular requirement as to the method of attachment to the support 7, as long as the east-west rotational shaft 5 is able to rotate. There is no particular requirement as to the configuration of the support 7, as long as it is strong enough to support the east-west rotational shaft 5 and the reflecting mirror 2.

Figure 2:
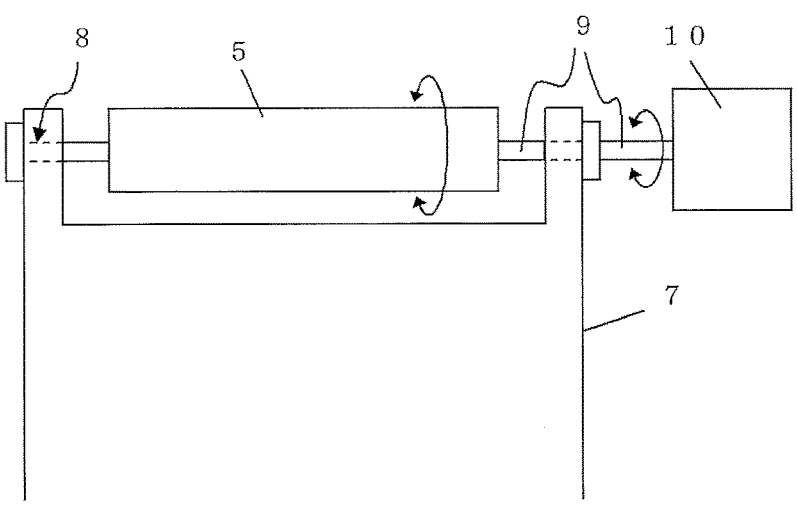
FIG. 2 is an explanatory diagram of an example of a relation between a support and an east-west rotational shaft.

FIG. 2 illustrates the relation between the support and the east-west rotational shaft. FIG. 2 is a detail as viewed from arrow 'A' in FIG. 1.

As depicted in FIG. 2, a spindle 9 attached to the east-west rotational shaft 5 can be positioned in through holes 8 opened in the support 7. With this sort of construction, the axial rotation of the spindle 9 can axially rotate the east-west rotational shaft 5.

There is no particular requirement as to the length of the east-west rotational shaft 5, and it can be short so as to avoid interfering with the north-south rotation of the mirror frame 3. A shorter shaft makes it possible to reduce material costs and increase ease of handling and transport.

As depicted in FIG. 1, one of a pair of arms 6 is attached to either side of the east-west rotational shaft 5 in the east-west direction. The length of the arms 6 can be determined by the size of the mirror frame 3, to which they are attached via the north-south rotational unit 4. There is no particular requirement as to the configuration of the arms 6, and they can be cylindrical or flat as required. The arms can be selected as appropriate to support the weight of the mirror frame 3 and the reflecting mirror 2, etc.

Using the east-west rotational shaft 5 as the rotational axis, the arms 6 and mirror frame 3 can be rotated as an integrated unit in the east-west direction.

There is no particular requirement as to the method by which the east-west rotational shaft 5 is made to rotate, and a motor can be used, for example.

As depicted in FIG. 2, a motor 10 can be connected to the spindle 9. The drive control of the motor 10 can be used to control the axial rotation of the spindle 9 and the axial rotation of the east-west rotational shaft 5. The motor 10 should have sufficient output to rotate the arms 6, etc. via the east-west rotational shaft 5. Because the east-west rotation of the arms 6, etc. is centered around the east-west rotational shaft 5, a motor with relatively small output is sufficient. A small motor makes cost savings possible.

Figure 3:
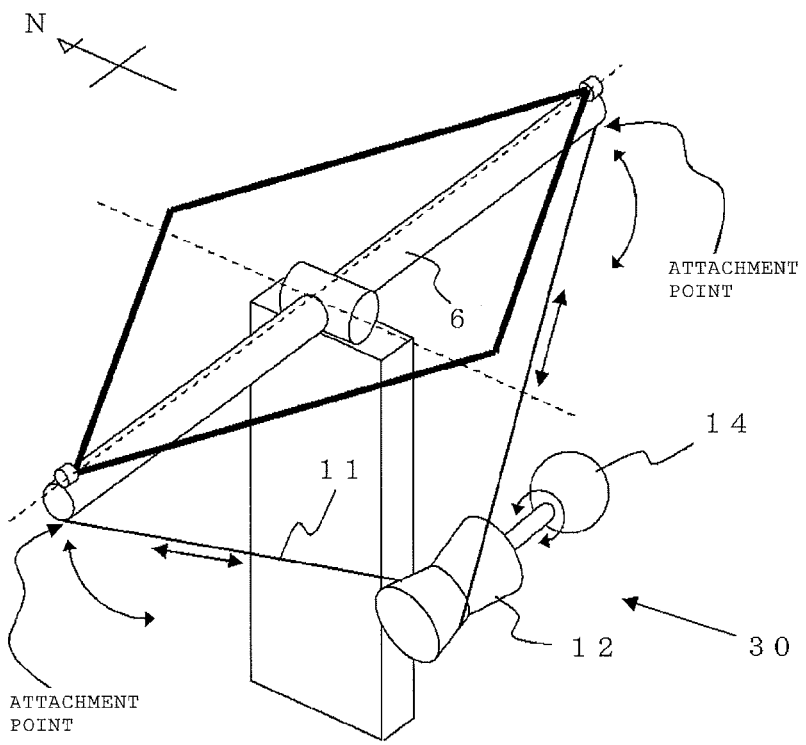
FIG. 3 is an explanatory diagram of an example of a mechanism used to rotate arms, etc. in the east-west direction.

FIG. 3 illustrates another example of the mechanism used to rotate the arms, etc. in the east-west direction, using the east-west rotational shaft as the rotational axis.

As depicted in FIG. 3, there is an east-west chain 11 attached to the ends of both arms 6, and the east-west chain 11 is hooked to an east-west chain length adjusting unit 30. Here, a Japanese hand drum tsuzumi-shaped (drum-shaped) pulley 12 is shown as an example of an east-west chain length adjusting unit 30.

There is no particular requirement as to the east-west chain 11, but it can be a ladder chain, for example. A chain may be used, on which the tsuzumi-shaped pulley 12 can be hooked as appropriate, such that rotation of the tsuzumi-shaped pulley will wind the chain or release it to the opposite side.

Figure 4:
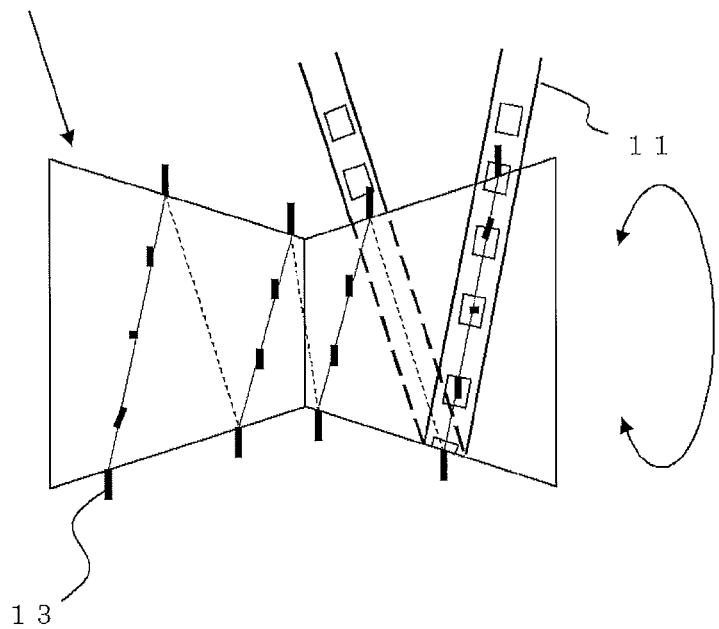
FIG. 4 is a schematic diagram of an example of a tsuzumi-shaped pulley.

FIG. 4 illustrates an example of the tsuzumi-shaped pulley 12. The tsuzumi-shaped pulley 12 can drive rotation, and has an outer diameter that changes in the rotational axial direction, like an tsuzumi. In other words, the outer diameter becomes smaller moving toward the center in the direction of rotational axis.

The outer perimeter can have a groove or, as depicted in FIG. 4, projections 13 like those of a gear wheel arranged in a helix pattern to hook the ladder chain or other chain 11.

With this sort of tsuzumi-shaped pulley 12, more of the east-west chain 11 is hooked at the outer side of the pulley where the outer diameter is larger in the rotational axial direction (the length of east-west chain 11 wrapped around the pulley is long), and less of the east-west chain 11 is hooked at the inner side of the pulley where the outer diameter is smaller in the rotational axial direction (the length of east-west chain 11 wrapped around the pulley is short).

With the rotation drive of the tsuzumi-shaped pulley 12, the length of east-west chain 11 between the tsuzumi-shaped pulley 12 and the location of the arms 6 at which the east-west chain is attached is adjusted, and the pair of arms 6 etc. is rotated in the east-west direction, with the east-west rotational shaft as the rotational axis.

The projections 13 can be placed as necessary for smooth rotation of the arms 6, etc.

There are no particular requirements as to the means of rotating the tsuzumi-shaped pulley 12; for example, a separate motor 14 as depicted in FIG. 3 can be used. In this case as well, the east-west rotation of the arms 6, etc. is centered around the east-west rotational shaft 5, and so a small motor is sufficient.

There are no particular requirements as to the positioning of the tsuzumi-shaped pulley 12 and the motor 14, but by positioning these components below the arms 6, the center of gravity of the heliostat apparatus as a whole is lowered, increasing stability.

Figure 13:
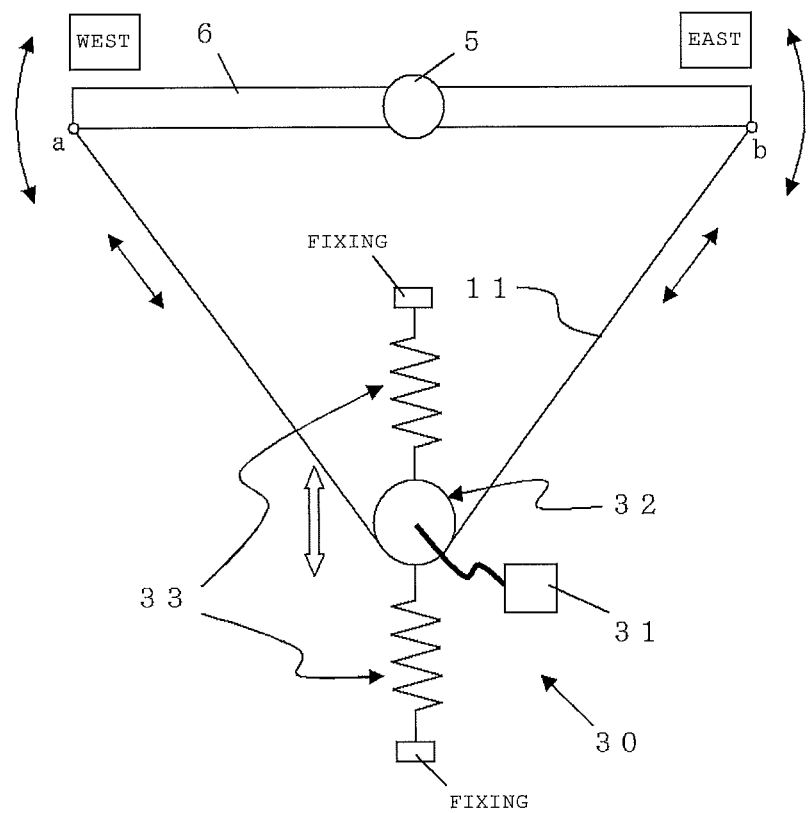
FIG. 13 is an explanatory diagram of another example of the mechanism used to rotate the arms, etc. in the east-west direction.

Another example of an east-west chain length adjusting unit is illustrated in FIG. 13.

As depicted in FIG. 13, the east-west chain length adjusting unit 30 is comprised of a pulley 32 on which the east-west chain 11 is hooked, two springs 33 attached at the top and bottom of the pulley 32, and a motor 31 to rotate the pulley 32. There are no particular requirements as to a fixing destination of the other end of the springs 33; for example, they can be fixed on the support, etc.

The rotation drive of the motor 31 rotates the pulley 32, and as the length of the east-west chain 11 between the pulley 32 and attachment point 'a', and the length of the east-west chain 11 between the pulley 32 and attachment point 'b' are adjusted, the arms 6 and mirror frame rotate as an integrated unit, for example, lowering the east edge while raising the west edge.

The position of the pulley 32 is determined by the balance between factors such as the gravitation of the springs 33 and the tensile force of the east-west chain. With the rotation of the pulley 32, the tensile force of the east-west chain 11 may change, but the balance between the changed tensile force of the east-west chain 11 and the gravitation of the springs 33 will be automatically established again. In order to maintain this balance in response to rotation of the pulley 32, the position of the pulley 32 shifts up and down.

Figure 21:
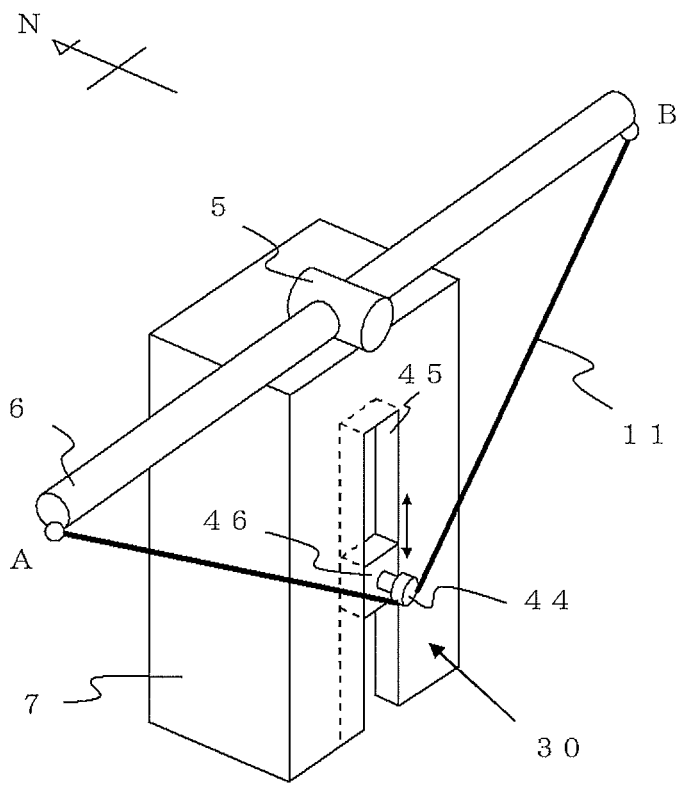
FIG. 21 is an explanatory diagram of another example of the mechanism used to rotate the arms, etc. in the east-west direction.

A further example of an east-west chain length adjusting unit is illustrated in FIG. 21.

As depicted in FIG. 21, the east-west chain length adjusting unit 30 is comprised of a gear 44 on which the east-west chain 11 is hooked, a rail 45 installed on the support 7, and a lifting unit 46 attached to the gear 44 that can go up and down along the rail 45. The lifting unit 46 can have a built-in motor to rotate the gear 44, or a separate motor can be used.

With the rotational drive of the motor in the lifting unit 46, the gear 44 is rotated, and as the length of the east-west chain 11 between the gear 44 and attachment point 'A', and the length of the east-west chain 11 between the gear 44 and attachment point 'B' are adjusted, the arms 6 and mirror frame rotate as an integrated unit in the east-west direction.

The rotation of gear 44 causes the tensile force of the east-west chain 11 to change, in response to which the gear 44 and the lifting unit 46 automatically shift upward or downward along the rail 45 and therefore the height position of them are determined.

The east-west chain length adjustment unit is described for rotation in the east-west direction as above, but with the sort of mechanism depicted in FIG. 3, FIG. 13, or FIG. 21, it is possible not only to simply rotate the arms 6 in the east-west direction, but to maintain the position of the arms 6 through the tensile force of the east-west chain 11 as well. This prevents wind-related shaking of the arms 6 and the reflecting mirror 2, and prevents the reflected sunlight from deviating from the target location. This makes it possible to stably reflect sunlight onto the desired location, increasing the light collection efficiency.

This mechanism is not limited to the tsuzumi-shaped pulley depicted in FIG. 4, the pulley with springs depicted in FIG. 13, or the gear and lifting unit depicted in FIG. 21. As long as the east-west chain 11 can be wound as necessary, and the length of the east-west chain 11 between the pulley and the attachment point can be adjusted as necessary, and the arms 6 can be rotated as necessary, other types of pulleys can be used, as well as other types of apparatuses. Systems using wire, etc. in place of chains can also be employed.

The mechanism used to rotate the arms 6, etc. can consist of the motor 10 depicted in FIG. 2 alone, or of any of the components depicted in FIG. 3, FIG. 13, or FIG. 21 alone, or the components depicted in FIG. 2 and FIG. 3 (or FIG. 13, FIG. 21) can be combined.

(Rotation in the North-South Direction)

The north-south rotational shaft 16 is described as follows.

Figure 5:
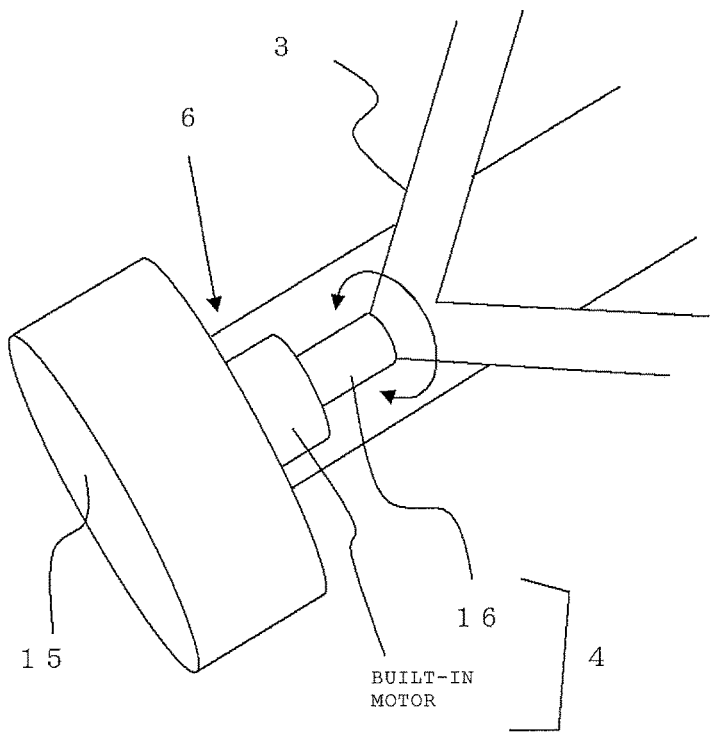
FIG. 5 is an explanatory diagram of an example of a north-south rotational unit.

FIG. 5 is an enlarged view of the end of one of the arms 6, with an example of a north-south rotational unit having the north-south rotational shaft 16.

The north-south rotational unit 4 is provided on the ends of each of the pair of arms 6. In the example illustrated in FIG. 5, in the cylindrical end piece 15 of each arm 6, a north-south rotational unit 4 with a north-south rotational shaft 16 is provided. A built-in motor is attached to the north-south rotational shaft 16, which makes possible the axial rotation of the north-south rotational shaft 16. The north-south rotational shafts 16 face each other, and are connected to the mirror frame 3 (depicted here as a quadrilateral frame), such that their axial rotation can cause the mirror frame 3 to rotate in the north-south direction.

Figure 6:
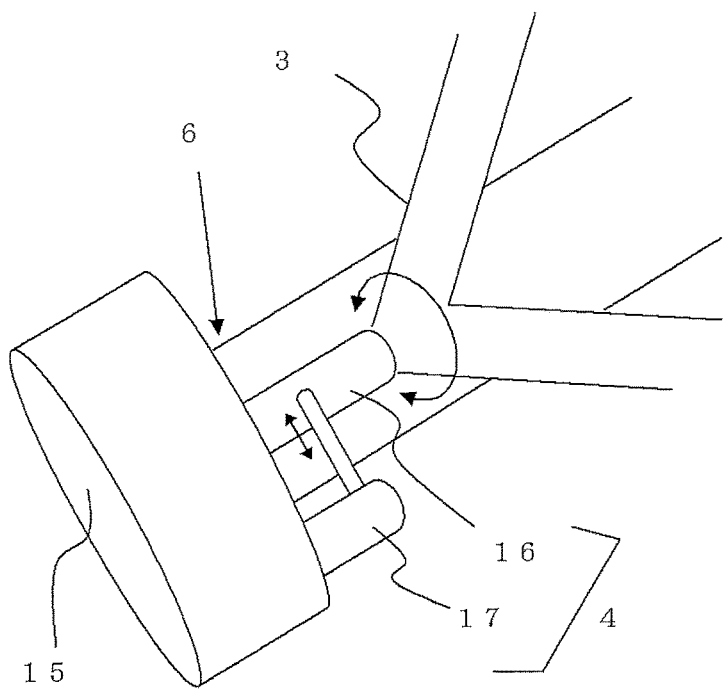
FIG. 6 is an explanatory diagram of another example of a north-south rotational unit.

FIG. 6 depicts another example of a north-south rotational unit.

Unlike FIG. 5, the north-south rotational shaft 16 is not equipped with a built-in motor, but the end piece 15 of each of the arms 6 is equipped with an actuator 17, and the end piece of the actuator 17 is connected to the side of the north-south rotational shaft 16. The drive of the actuator 17 moves the end piece back and forth, such that the north-south rotational shaft 16 to which the end piece is connected rotates in a circumferential direction (i.e., axial rotation), and the mirror frame 3 rotates in the north-south direction.

The north-south rotational unit 4 is not limited to these embodiments, and any structure that rotates the mirror frame 3 as required in the north-south direction with the north-south rotational shaft 16 as the rotational axis is acceptable. With a structure that uses the axial rotation of the north-south rotational shaft 16, such as that depicted in FIG. 5 or FIG. 6, the mirror frame 3 can be rotated at relatively low torque, meaning that even a small motor on the north-south rotational shaft 16 will be sufficient.

FIGS. 5 and 6 show the north-south rotational shaft 16 positioned inside the end pieces 15, but there is no particular requirement as to this positioning. For example, as illustrated by another example in FIG. 14, it is also possible to position the north-south rotational shaft 16 on the end of the member that projects from the end piece 15, perpendicular to the arm 6. With the north-south rotational shaft 16 attached to this end, it is possible to further separate the mirror frame 3 that is attached to the north-south rotational shaft 16 from the arm 6. More specifically, a relatively wide space can be created between the mirror frame 3 and the arm 6. With this sort of space, even if mirror frame 3 has a rear support member as described below, it is possible to effectively prevent the rear support member from interfering with the rotation of the mirror frame 3 by contact of the rear support member with the arms 6.

Figure 14:
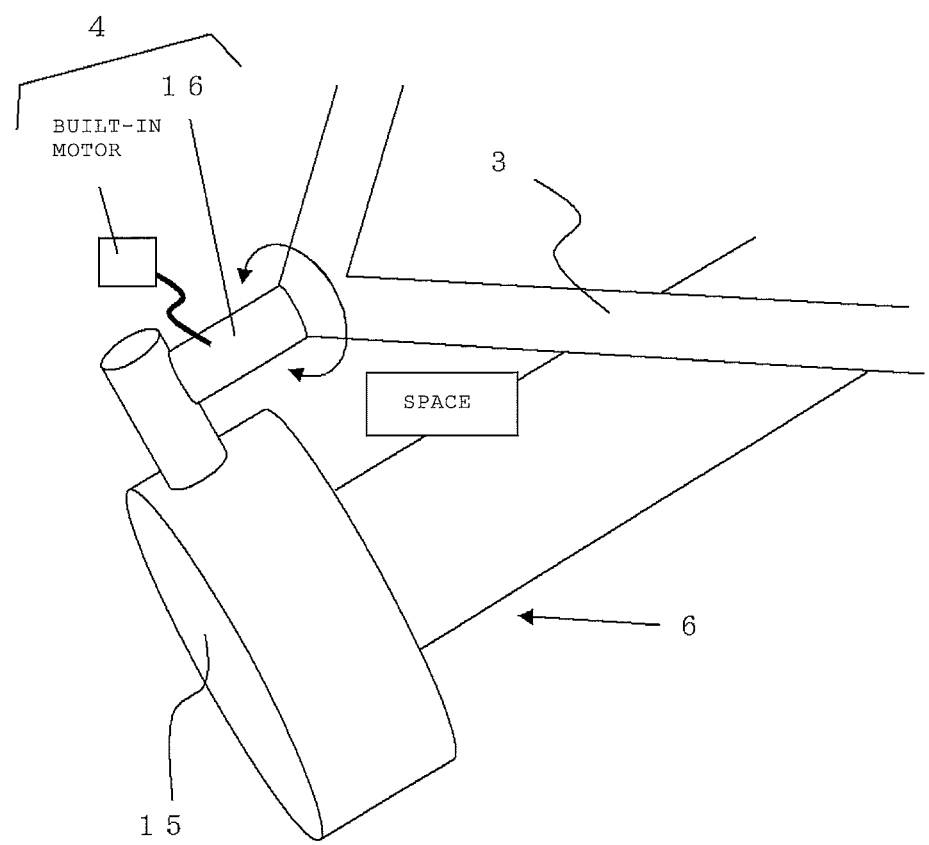
FIG. 14 is an explanatory diagram of another example of a north-south rotational unit.

The examples depicted in FIGS. 5, 6, and 14 show the north-south rotational shaft 16 itself being rotated by the actuators or the built-in motors, etc., but this is not a requirement. For example, configurations that use chains, as depicted in FIGS. 3, 13, and 21, etc., are also possible.

FIGS. 3, 13, and 21 show an east-west chain attached to the east and west ends of the arms to rotate the arms in the east-west direction with the east-west rotational shaft as the rotational axis, but to rotate the mirror frame in the north-south direction with the north-south rotational shaft as the rotational axis, a north-south chain is attached at the north and south of the mirror frame. For a quadrangular frame as depicted in FIG. 1, for example, the chain could be attached at the north and south corners.

Figure 15:
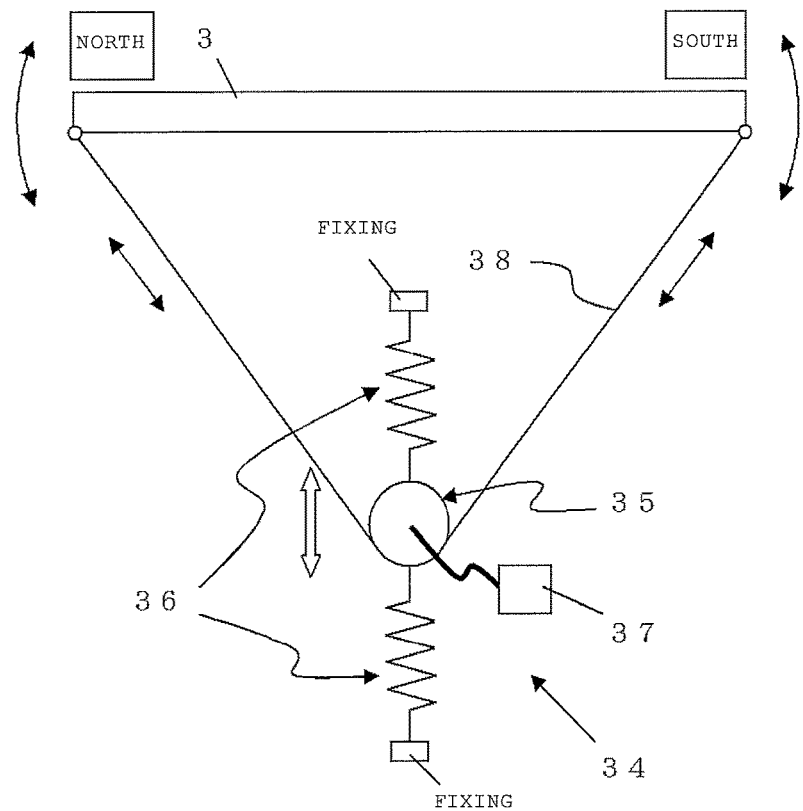
FIG. 15 is an explanatory diagram of an example of a north-south chain length adjusting unit 34.

FIG. 15 illustrates an example of a north-south chain length adjusting unit 34. As shown here, the north-south chain length adjusting unit 34 is comprised of a pulley 35 to which the north-south chain 38 is hooked, two springs 36 connected to the top and bottom of the pulley 35, and a motor 37 to rotate the pulley 35. There are no particular requirements as to a fixing destination of the other end of the springs 36; for example, they can be fixed on the support, etc.

The mechanism for driving the north-south chain length adjusting unit 34 drive and rotating the mirror frame 3 (in the north-south direction) can be similar to the mechanism for driving the east-west chain length adjusting unit and rotating the arm (in the east-west direction) depicted in FIG. 13, for example.

An tsuzumi-shaped pulley can also be used as the north-south chain length adjusting unit instead of the sort of pulley with springs depicted in FIG. 15. In this case, the mechanism can be similar to the tsuzumi-shaped pulley depicted in FIG. 3, for example.

It is alternatively possible to use gears and a lifting unit, as depicted in FIG. 21.

Figure 11:
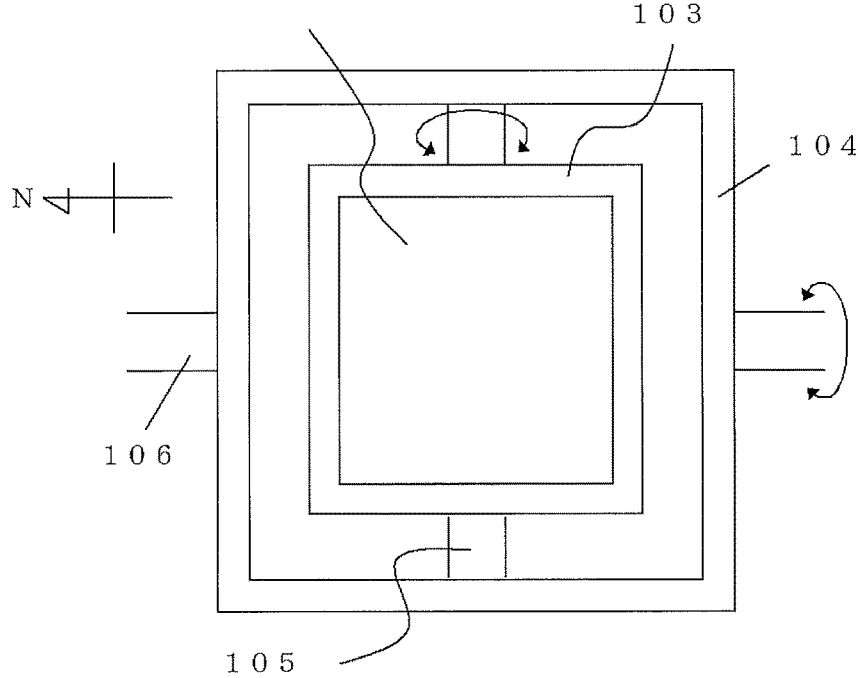
FIG. 11 is an explanatory diagram of an example of a conventional heliostat apparatus.
Figure 12:
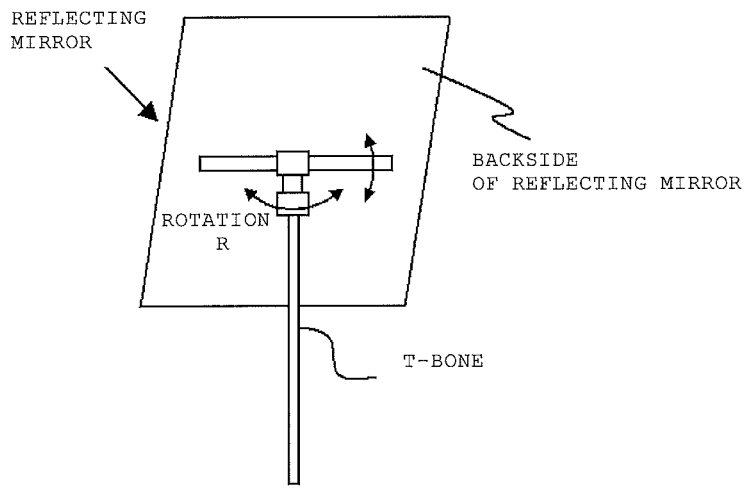
FIG. 12 is an explanatory diagram of another example of a conventional heliostat apparatus.

The rotational mechanisms of the present invention are as described above. In contrast, examples of conventional heliostat mechanisms are illustrated in FIGS. 11 and 12. A T-shaped support (the "T-bone") is attached to the back of the reflecting mirror in FIG. 12, and by rotating the parts of the T-bone, the reflecting mirror can be freely rotated along with the movement of the sun.

However, high torque is needed for this rotation, particularly around the support (rotation "R"). In other words, a small motor may not be sufficient to control the angle of the reflecting mirror.

In contrast, with the types of east-west direction and north-south direction rotational mechanism depicted in FIGS. 1-6, 13-15, and 21, the arms 6 and mirror frame 3 can be adequately rotated with a small motor and low torque to adjust the reflecting mirror 2 to the desired angle.

Because the angle of the reflecting surface can be separately adjusted in the east-west and north-south directions, the controls can be simpler than those of the T-bone, accuracy can be greatly improved, and light collection efficiency can be increased.

The mirror frame 3 is described as follows.

There are no particular requirements as to the form of the mirror frame 3, as long as there is only one mirror frame that can support at least one reflecting mirror 2. The mirror frame can simply frame the outside of a single mirror as depicted in FIG. 1, or it can be configured as depicted in FIG. 7.

Figure 7:
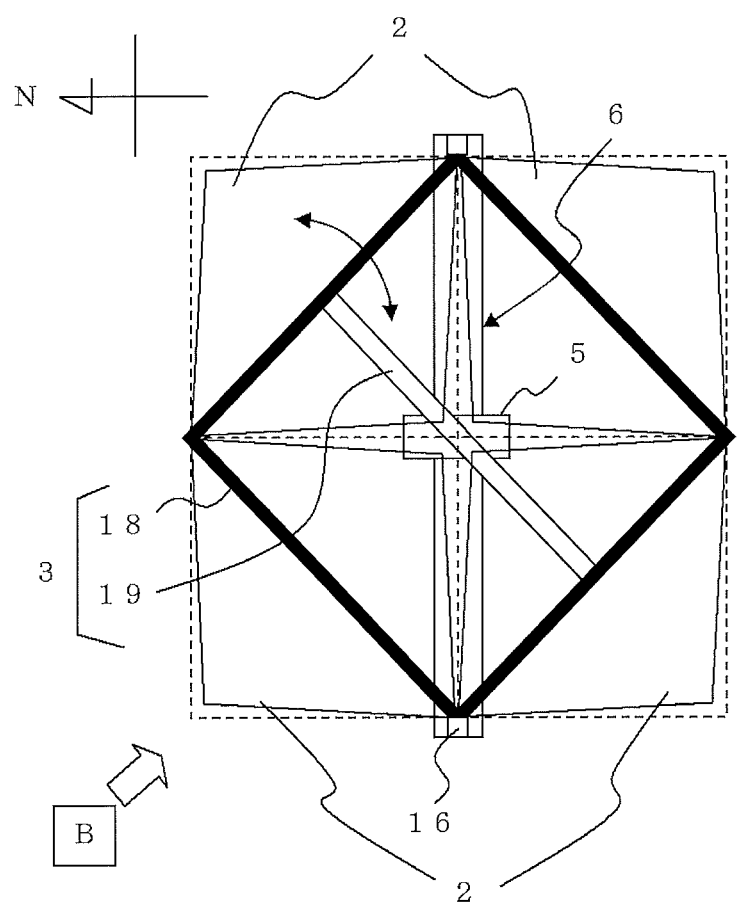
FIG. 7 is an explanatory diagram of an example of a mirror frame.

FIG. 7 is a planar representation of a mirror frame 3. The north-south rotational shaft 16, the east-west rotational shaft 5, and the arms 6 have been included to show the positional relation of the components.

The mirror frame illustrated in FIG. 7 is comprised of one quadrangular frame (frame 18) and a rear support member 19. Here the four corners of the frame 18 are aligned to the north, south, east, and west, and the rear support member 19 is aligned from the northeast to the southwest, and attached to the northeast and southwest parts of the frame 18.

The reflecting mirrors 2 are also depicted. Here, four square reflecting mirrors 2 are installed, but there is no particular requirement for square mirrors, and they can also be round, etc. A reflecting mirror 2 is positioned on each of the four sides of the frame 18. Each reflecting mirror 2 is positioned such that the diagonal of the reflecting mirror 2 is aligned with a side of the frame 18, and the reflecting mirror 2 can rotate with the side of the frame 18 as fulcrum. Here the reflecting mirrors 2 are tilted toward the inside of the frame 18 (the reflecting mirrors 2 are drawn in the tilted position. For reference, non-tilted (flat) positioning is also shown, represented by a dotted line.) and their backs are supported by a rear support member 19. This tilting makes it possible to collect the sunlight reflected from the four reflecting mirrors at a single spot. The angle of the tilt can be determined in accordance with the focal point.

If, for example, four mirrors are installed without tilting, i.e., if the four mirrors together comprise a single flat reflecting mirror, the single flat reflecting mirror is subject to bending and shaking in winds hitting it head-on, reducing sunlight collection efficiency. By tilting the four reflecting mirrors as described above, resistance to direct winds can be reduced, limiting the loss of light collection efficiency. Because the effects of wind resistance are reduced, it is possible to rotate the reflecting mirrors with a relatively low power output.

Figure 8:
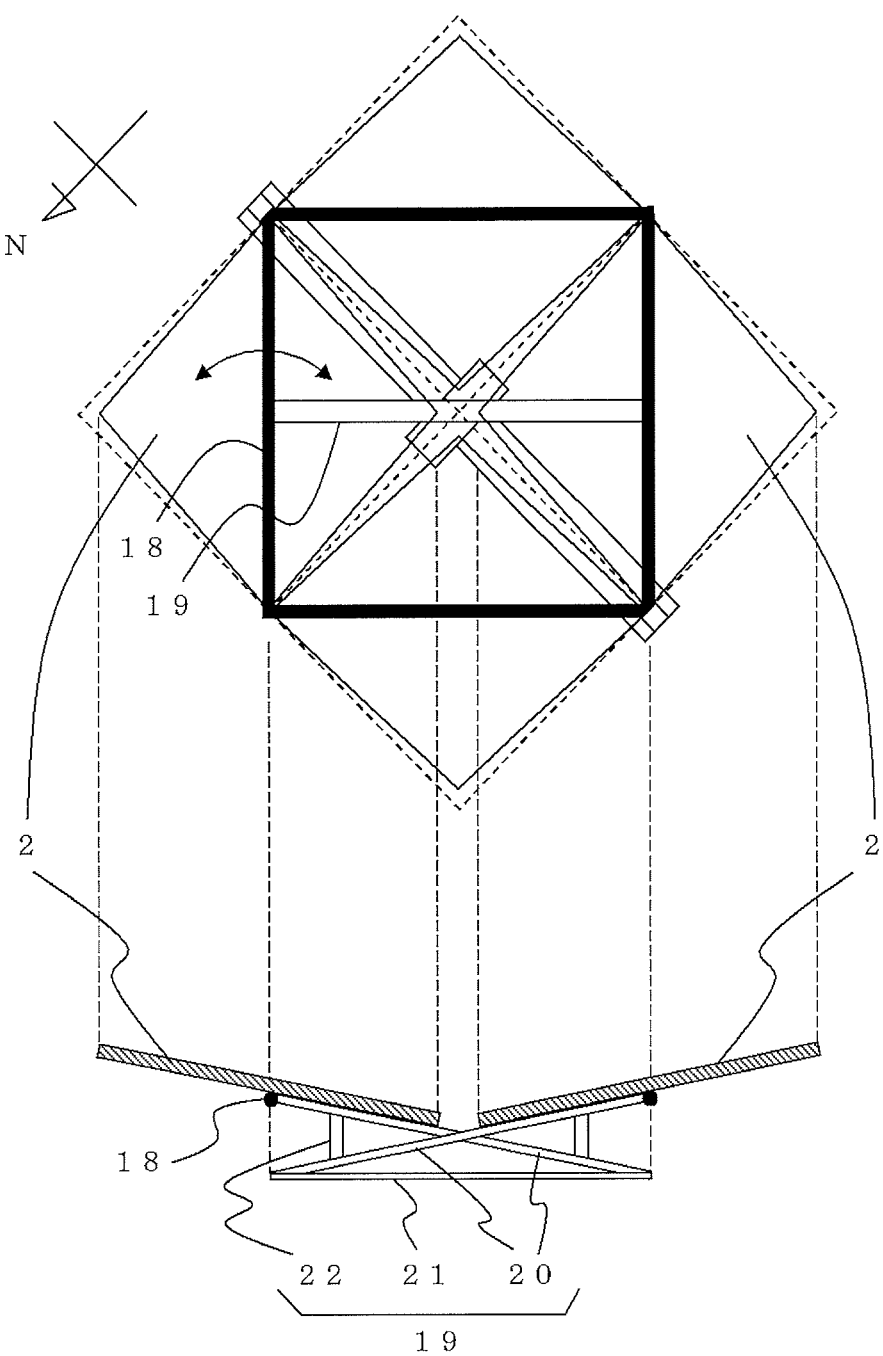
FIG. 8 is an explanatory diagram of an example of a positional relation between a frame and a rear support member.

FIG. 8 shows the positional relation between the frame 18 and the rear supporting member 19. FIG. 8 shows the assembly as viewed from arrow 'B' in FIG. 7 (i.e., it is a vertical cross-section of the rear support member 19). A planar representation of the mirror frame 3 is also included in FIG. 8 to illustrate the positional relation between the components.

There are no particular requirements as to the form of the rear support member 19, and here, it is assembled from several planks. The components include two support planks 20, one end of each of which is connected to the side of the frame 18, a base plank 21 to which the other ends of the support planks 20 are connected, and joists 22, etc. Modifications such as putting notches in the support planks 20 at the point where they cross to fit them together, etc., are possible. The support plank 20 is positioned on a tilt, and can support the back of the reflecting mirror 2 on its upper surface. The angle of the tilt can be determined in accordance with the focal point of the reflected light as described above.

By using the base plank 21 and the joists 22, the construction of the rear support member 19 can be strengthened to provide greater support for the reflecting mirrors 2.

The rear support member is not limited to this construction, and any construction can be used as appropriate, as long as it can support the back of the reflecting mirror 2.

The same sort of rear support member can be configured from northwest to southeast. It is also possible to combine two rear support members as appropriate to support the backs of all four reflecting mirrors. The rear support member can be configured such that it does not interfere with the rotational components, such as the arms or the east-west rotational shaft, etc.

The larger the reflecting mirrors are, the heavier they become and the more susceptible to significant bending, which will have a negative impact on light collection. However, using the type of mirror frame 3 described above, plural reflecting mirrors can be used, reducing the weight and area of each mirror and thereby limiting bending. This makes it possible to improve the light collection efficiency. It also makes it easier to manufacture and transport the reflecting mirrors, reducing costs and improving ease of handling.

Further, because the reflecting mirror 2 is supported from the back by the rear support member 19, it is possible to effectively limit wind-related shaking of the reflecting mirrors. This can also lead to improvements in the light collection efficiency.

The construction of the rear support member 19 and the arms 6 can be designed as appropriate to provide space between the mirror frame 3 (particularly the rear support member 19), the arms 6, and the east-west rotational shaft 5 so that these components don't hit each other when the reflecting mirror 2 and mirror frame 3 are rotated in the north-south direction.

Figure 16:
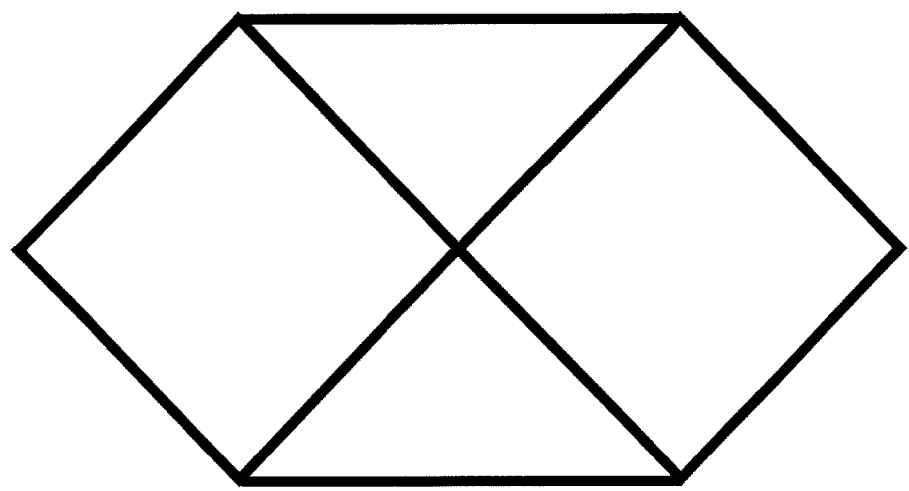
FIG. 16 is an explanatory diagram of another example of the mirror frame.

FIG. 16 depicts another configuration of the mirror frame.

Here, mirror frame 40 takes the form of two adjacent diamond-shaped (square) frames connected by two rods.

Figure 17:
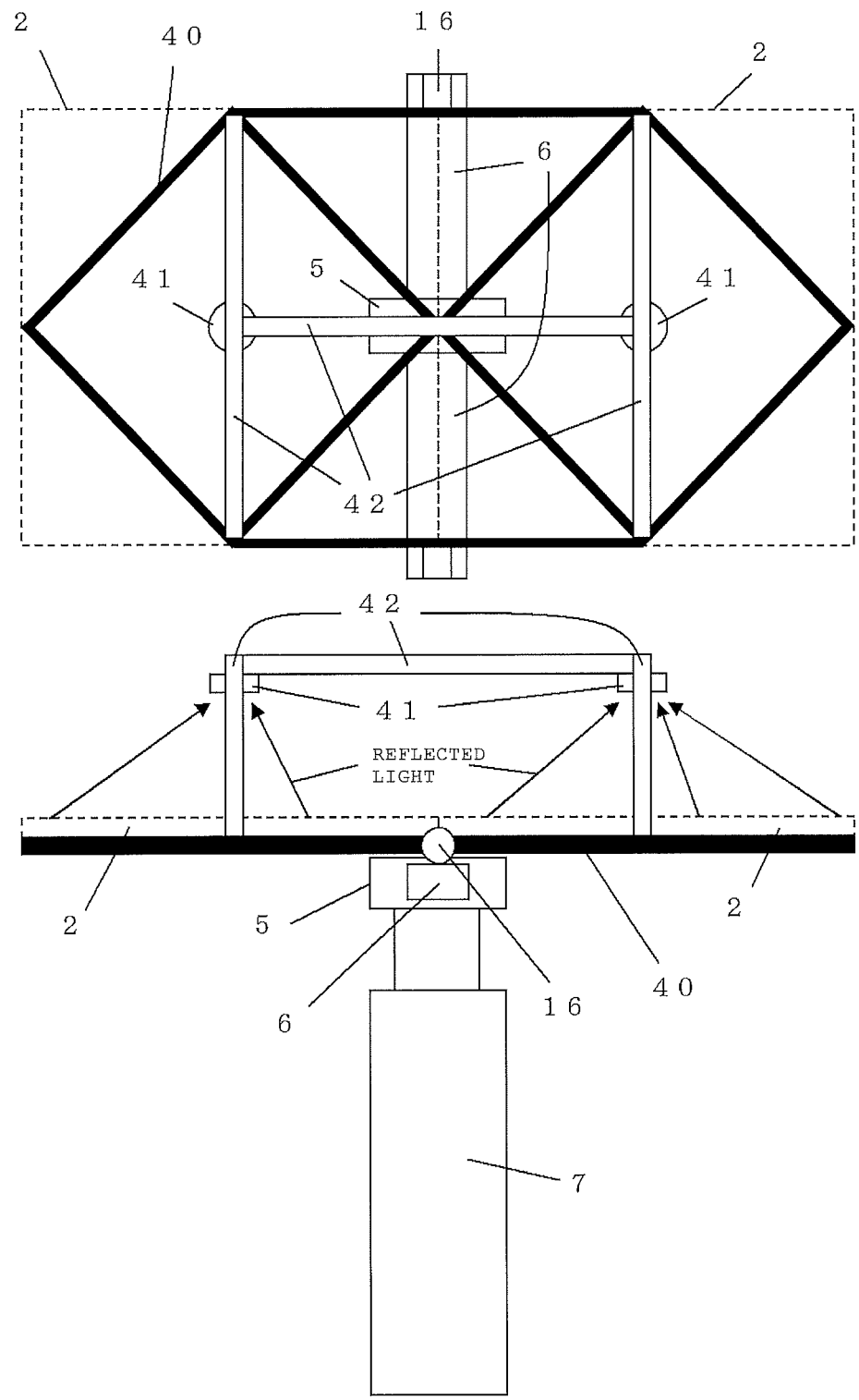
FIG. 17 is an explanatory diagram of an example of the positional relation between the mirror frame and other components.

The positional relation between the mirror frame 40 and the other components is illustrated in the planar (top) view and vertical cross-section (bottom) view of FIG. 17. Here, the relation between the east-west rotational shaft 5, the arms 6, the north-south rotational shaft 16, and the support 7 in particular is shown. A photovoltaic cell 41 and photovoltaic cell support base 42 are also depicted as an example of the use of this design for a concentrating photovoltaic apparatus, as described below.

As depicted in FIG. 17, a total of two reflecting mirrors 2 can be mounted. Each of these can be divided such that eight reflecting mirrors in total are mounted. The top of the mirror frame 40 connects to the support base 42, on which two photovoltaic cells 41 are positioned, such that sunlight reflected by the reflecting mirrors 2 can be collected in the photovoltaic cells 41.

There are no particular requirements as to the form of the mirror frame, and various forms can be used.

As depicted in FIGS. 3 and 15, etc., when the rotational mechanism includes the east-west chain or the north-south chain, a structure can be added to the mirror frame in order for the structure to hold the shape of the mirror frame.

Figure 18:
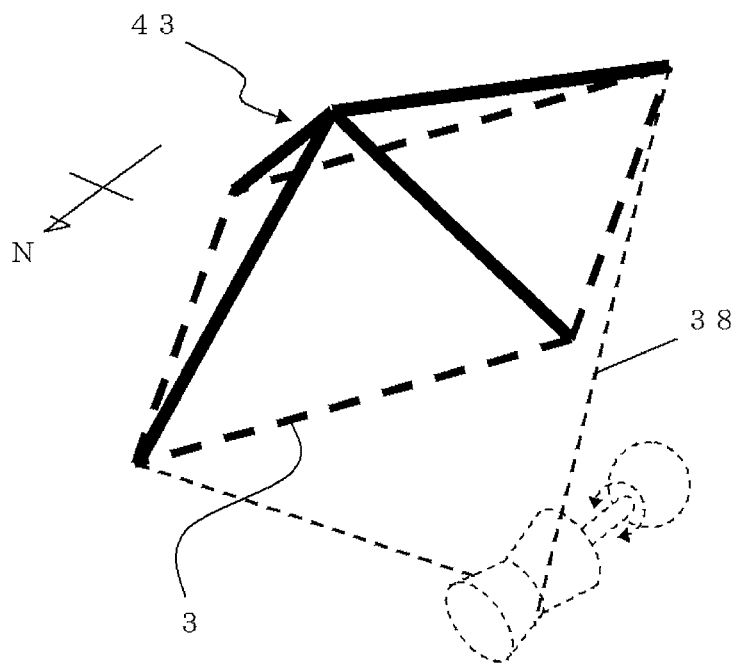
FIG. 18 is an explanatory diagram of an example of the structure that holds the mirror frame's shape.

FIG. 18 illustrates an example of such a shape-holding structure. FIG. 18 shows the north-south chain 38 attached to the mirror frame 3, but the structure would be essentially the same when using the east-west chain as well. It is particularly effective to locate the structure 43 on the opposite side of the mirror frame 3 from the north-south chain 38.

This structure 43 holds the shape of the mirror frame 3, such that it is possible to apply adequate force to the north-south chain 38 that pulls the mirror frame 3 from the opposite side. This makes it possible to prevent slackening in the chain, strengthen the rotational mechanism to counter the effects of wind, and control the rotation of the mirror frame 3 with greater precision.

When used in a concentrating photovoltaic apparatus, the support base 42 (receiver) as depicted in FIG. 17 can also function as the structure 43.

The configuration of the reflecting mirrors that are supported by the mirror frame is described below.

Figure 19:
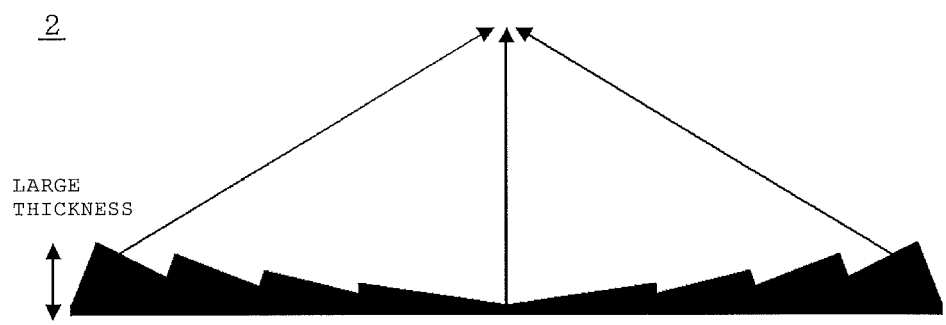
FIG. 19 is an explanatory diagram of an example of a Fresnel surface reflecting surface.

There are no particular requirements as to the configuration, as long as it includes at least one reflecting mirror. For example, a Fresnel surface can be used as the reflecting surface. FIG. 19 is a cross-section view of an example of a reflecting surface with a Fresnel surface. With this sort of Fresnel surface, it is easier to reflect sunlight to a single point for collection.

Figure 20:
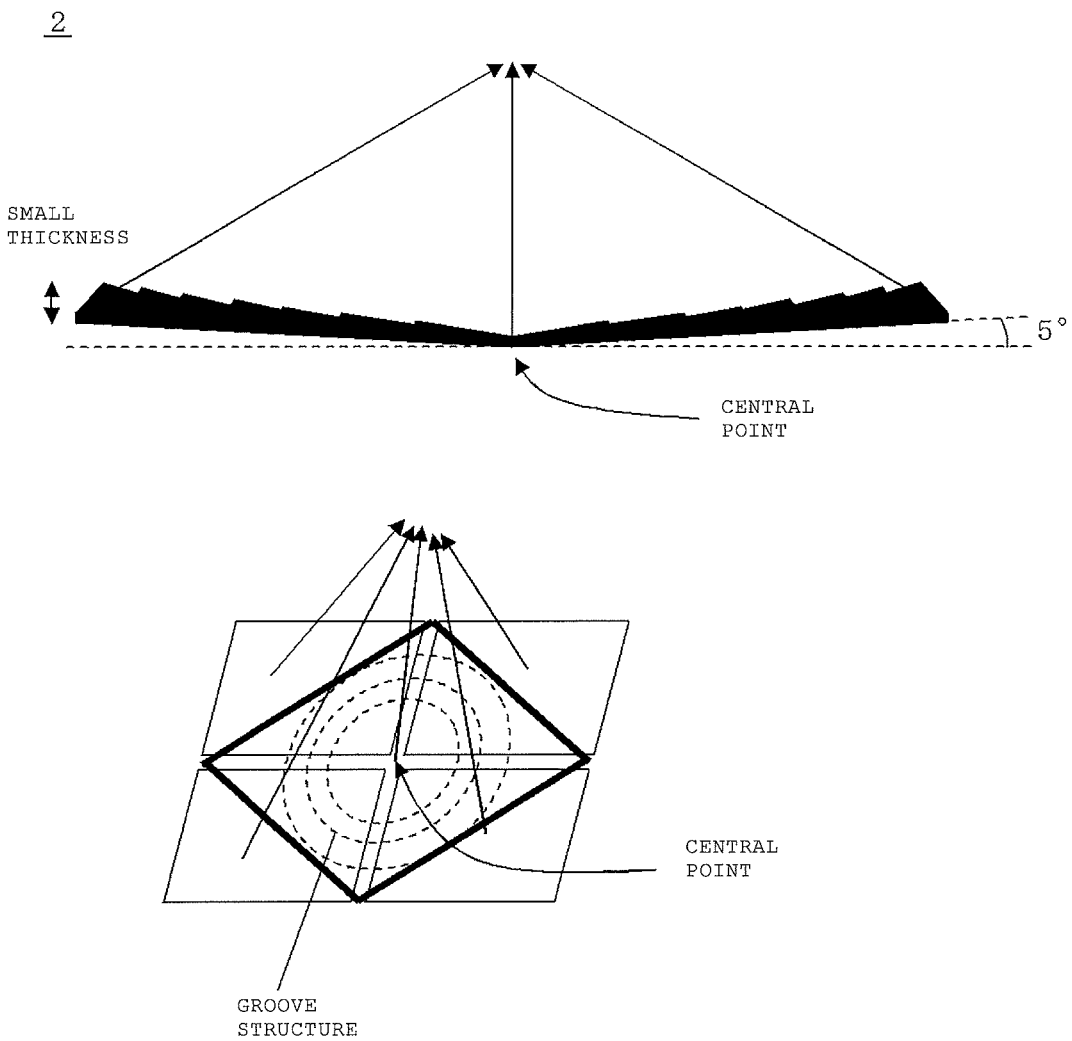
FIG. 20 is an explanatory diagram of an example of plural reflecting mirrors, the reflecting surface of each of which is a Fresnel surface.

A configuration with plural reflecting mirrors (for example, 4 mirrors), with each reflecting mirror positioned on an angle as illustrated in FIG. 20, is particularly effective for collecting light at a single point. FIG. 20 shows a configuration in which the single large reflecting mirror of FIG. 19 is divided into four, but with the reflecting mirrors positioned on an angle, it is possible to use thinner reflecting mirrors to focus in the same manner as FIG. 19. This is because the angle of the Fresnel surface can be reduced by the degree that it is tilted. The weight of the reflecting mirror can thus be reduced, and ease of handling improved. FIG. 20 shows a tilt angle of 5 degrees, but this is not a requirement, and the tilt angle can be determined as appropriate.

With four reflecting mirrors, the groove structure of the Fresnel surfaces possesses point symmetry with respect to the central point of all four reflecting mirrors. Thus when each of the reflecting mirrors is a square, there will only be one type of Fresnel surface groove structure. With rectangles, there will be two types of groove structures. In this way, it is possible to reduce the types of reflecting mirror Fresnel surface groove structures by half.

Other configurations of the reflected mirrors supported by the mirror frame are discussed below.

As noted earlier, the configuration should include at least one reflecting mirror.

Figure 29:
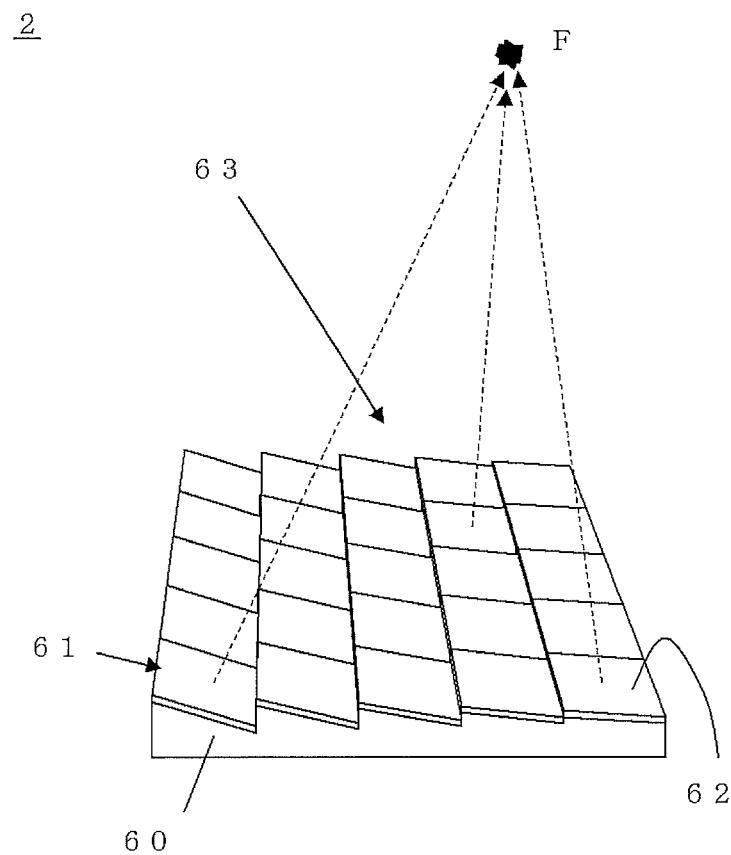
FIG. 29 is a schematic diagram of an example of the reflecting mirror of the present invention.

Each reflecting mirror in the present invention is depicted in detail in FIG. 29. The reflecting mirrors 2 of the present invention are principally comprised of a base 60 and plural reflecting mirror pieces 61. The plural reflecting mirror pieces 61 are arranged on the base 60 in a mosaic pattern to create the mosaic surface. This assembly of reflecting surfaces 62 of the reflecting mirror pieces 61 forms the reflecting surface 63 of a single reflecting mirror 2.

The focal point of the reflecting surface 63 of the reflecting mirror 2 is formed by the overlapping reflected sunlight from the various reflecting surfaces 62 of the reflecting mirror pieces 61. Light reflected by the various reflecting surfaces 62 of the reflecting mirror pieces 61 is collected at focal point F.

With the sort of heliostat apparatus that uses plural reflecting mirrors, as illustrated in FIGS. 7 and 8, each focal point is adjusted in relation to the position of each reflecting mirror such that the light reflected from all of the reflecting mirrors is collected at a single point.

The components of the reflecting mirror 2 are described in detail below.

Figure 30:
FIG. 30 is a schematic diagram of an example of a reflecting mirror piece.
Figure 31:
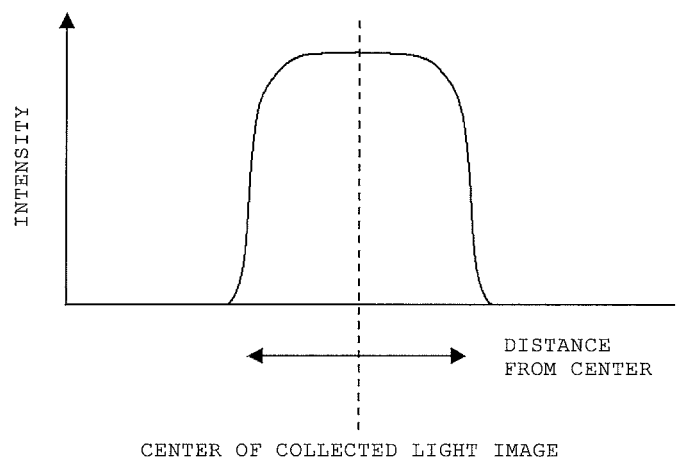
FIG. 31 is a graph depicting the intensity distribution of light collected using the light collection method of the present invention.
Figure 32:
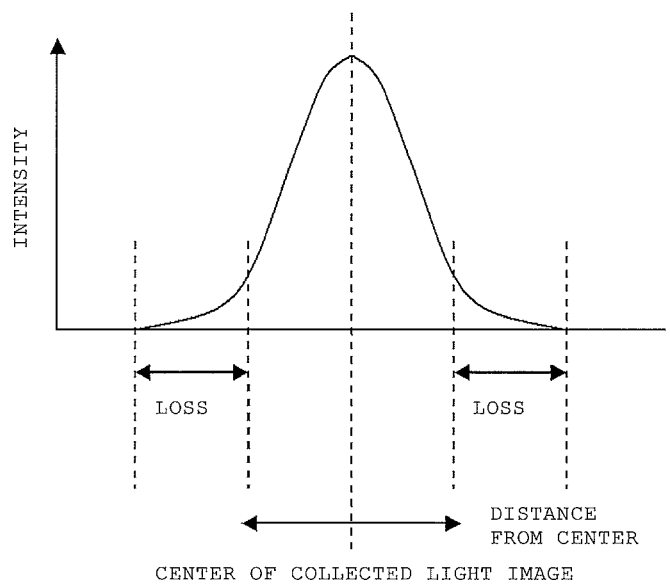
FIG. 32 is a graph depicting the intensity distribution of light collected using a conventional light collection method.
Figure 33:
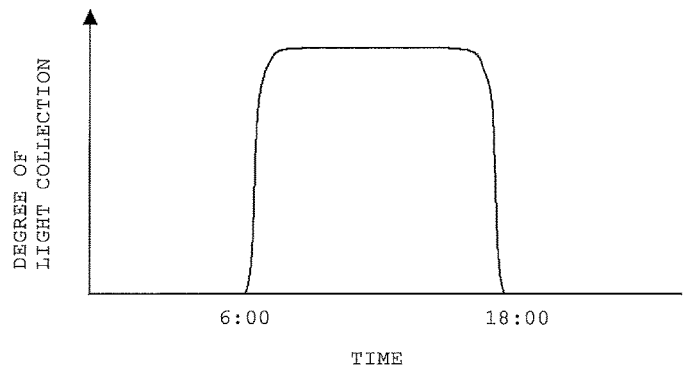
FIG. 33 is a graph depicting changes in the degree of light collection over the course of the day using the light collection method of the present invention.
Figure 34:
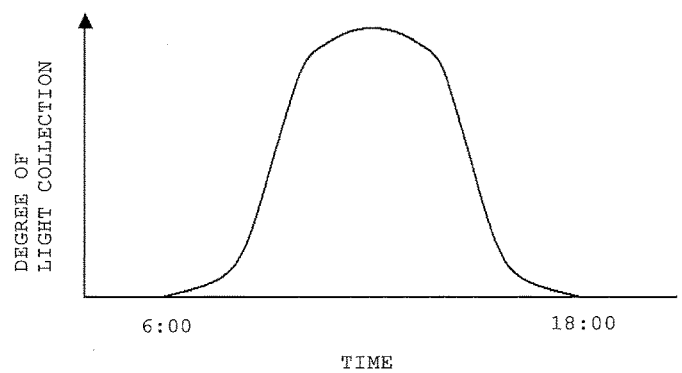
FIG. 34 is a graph depicting changes in the degree of light collection over the course of the day using a conventional light collection method.

As shown in FIG. 30, the reflecting mirror pieces 61 are flat. Because they are flat, they are easier to prepare than those with concave surfaces, for example. The shape of the pieces, whether square, diamond-shaped, or round, etc., can be decided on a case-by-case basis. There are no limitations on size or the number of pieces, which can be determined as necessary to achieve goals regarding collected light image uniformity, and ease of transport or handling, etc. Compared with one large reflecting mirror, the smaller area and simple form of the reflecting mirror pieces allow for mass production and lower cost preparations.

Because the reflecting surface 63 of the reflecting mirror 2 is made up of the reflecting surfaces 62 of plural reflecting mirror pieces 61, focal point F will be a polygon. On the other hand, with a single conventional large concave mirror, focal point F will be a circle.

Figure 26:
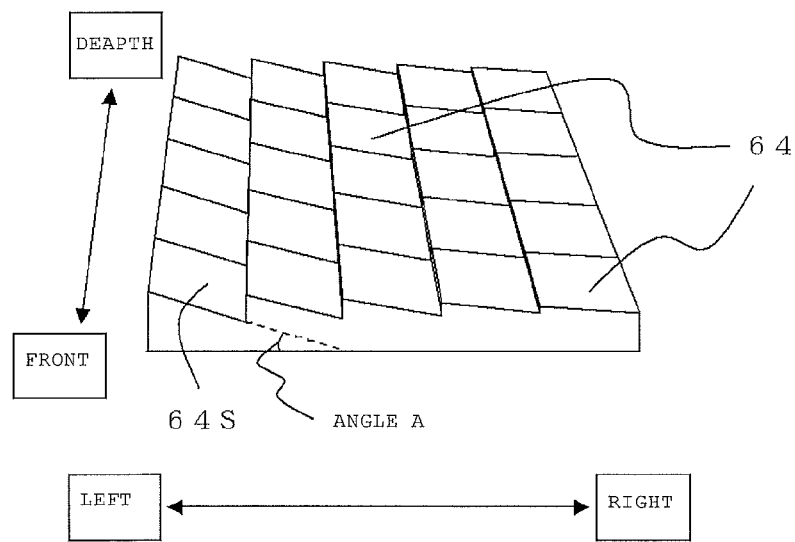
FIG. 26 is a schematic diagram of an example of a base.

The base 60 is described with reference to FIG. 26.

The upper surface of the base 60 is divided into mounting surfaces 64 on which the reflecting mirror pieces 61 are positioned. The angle of each of the plural mounting surfaces 64 is adjusted as appropriate for the sunlight reflected from the reflecting surface 63 of the mounted reflecting mirror pieces 61 forms a focal point. In the example in FIG. 26, the rear surface of the base is flat, and on the opposite side, where the reflecting mirror pieces 61 are mounted, each division (each mounting surface) is angled in relation to the flat rear surface. For example, the mounting surface 64S at the far left and front of FIG. 26 forms angle 'A' with the rear surface (longitudinally). Though omitted in FIG. 26, the mounting surface 64S has a prescribed angle with respect to the rear surface in the depth direction as well. In this example the base 60 is depicted with a flat rear surface that is described as the reference surface for the angle of the mounting surfaces 64, but the present invention is not limited to this configuration. The reference surface can be determined as appropriate, and mounting surface angles set with reference thereto accordingly.

By adjusting the angle of the mounting surfaces 64, the light reflected from the plural reflecting mirror pieces 61 can be collected in a single point even though the reflecting mirror pieces 61 positioned on the mounting surfaces 64 are flat.

There are no particular requirements as to the materials used for the base 60, but a light material is preferable for transport, and for minimizing the output of the motor, etc. used to rotate the base. The material should be strong enough to resist easily breaking in the wind.

There are also no particular requirements as to the method of construction. When preparing conventional reflecting mirrors, such as a single large concave mirror, it is necessary to make fine adjustments to the reflecting surface, etc., in order to adjust the focal point, making production troublesome and costly.

With the base and plural reflecting mirror pieces of the present invention, however, once the angles, etc. of the base's mounting surfaces are decided, the components can easily be mass-produced in accordance with these specifications. Being flat, the reflecting mirror pieces are also relatively easy to prepare. The present invention makes it possible to greatly reduce the effort and cost of production.

By using this sort of reflecting mirror, made up of a base and reflecting mirror pieces, it is possible to achieve a more uniform collected light image at the focal point than when a one large concave mirror is used. By creating a uniform collected light image while collecting reflected light, it is possible to improve the stability of electricity generation, etc.

Figure 27:
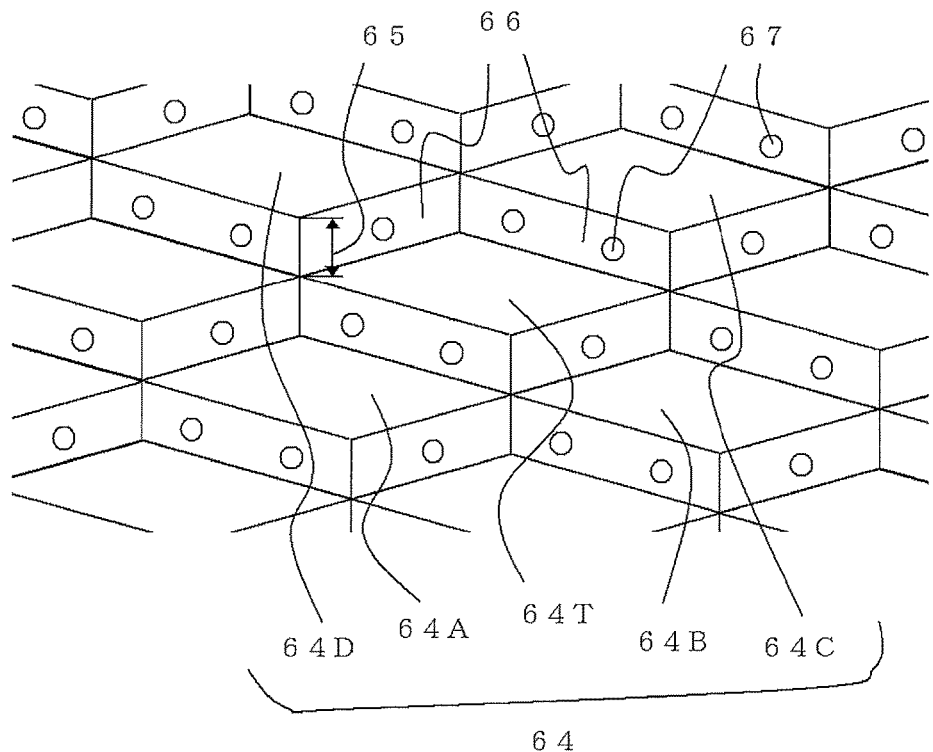
FIG. 27 is an explanatory diagram of an example of the position of the holes in the base.

The base 60 is constructed with holes passing through it. The position of these holes is illustrated in FIG. 27. As shown here, adjacent mounting surfaces (for example, for mounting surface 64T these would be mounting surfaces 64A, 64B, 64C, and 64D) are connected by steps 65 to the angle-adjusted mounting surface 64. There is no particular requirement as to the size of the steps 65, and it is possible to use steps that are all the same size, or to vary the height of the steps in relation to their position, etc.

The holes 67 are formed in the step surfaces 66 of the steps 65 that connect the adjacent mounting surfaces.

Figure 28:
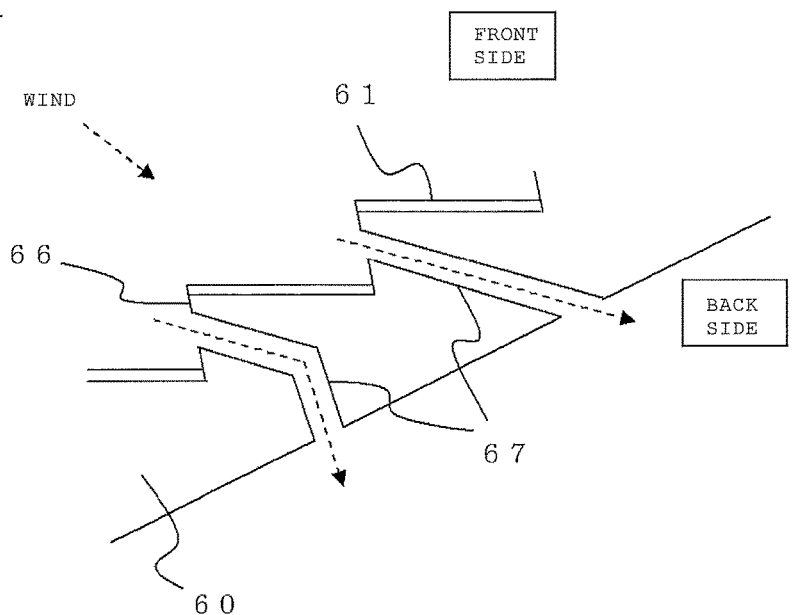
FIG. 28 is a cross-section view of an example of the shape of the holes in relation to the reflecting mirrors.

FIG. 28 depicts an example of a cross-section of a reflecting mirror, showing the shape of the holes. As shown here, the holes 67 pass through the base 60.

With holes 67 such as there, winds blowing on the front of the reflecting mirror 2 (i.e., on the side on which the reflecting mirror pieces 61 are positioned) can in part pass through the holes 67. This can reduce wind resistance on the reflecting mirror 2. It is also possible to reduce the weight of the base 60. This is preferable in that it makes it easy to support and rotate the reflecting mirror, and improves ease of transport.

The holes 67 can be straight, or they can bend in the middle. The shape of the holes can be determined as appropriate to allow the wind to pass through efficiently. There is no particular requirement as to the number of holes, as long as the number and the size of the holes is determined as appropriate to maintain the strength, etc. of the base.

It is possible to provide a solar heat collecting apparatus or concentrating photovoltaic apparatus equipped with one or more of the heliostat apparatuses of the present invention. As these systems can efficiently and easily collect light using reflecting mirrors, and they employ the heliostat apparatus 1 that is less costly than conventional heliostats, it is possible to reduce the cost of the system as a whole. Further, by using reflecting mirrors 2 as depicted in FIG. 29, etc., more adequate light collection is possible, increasing the stability of electricity generation or heat collection.

Figure 9:
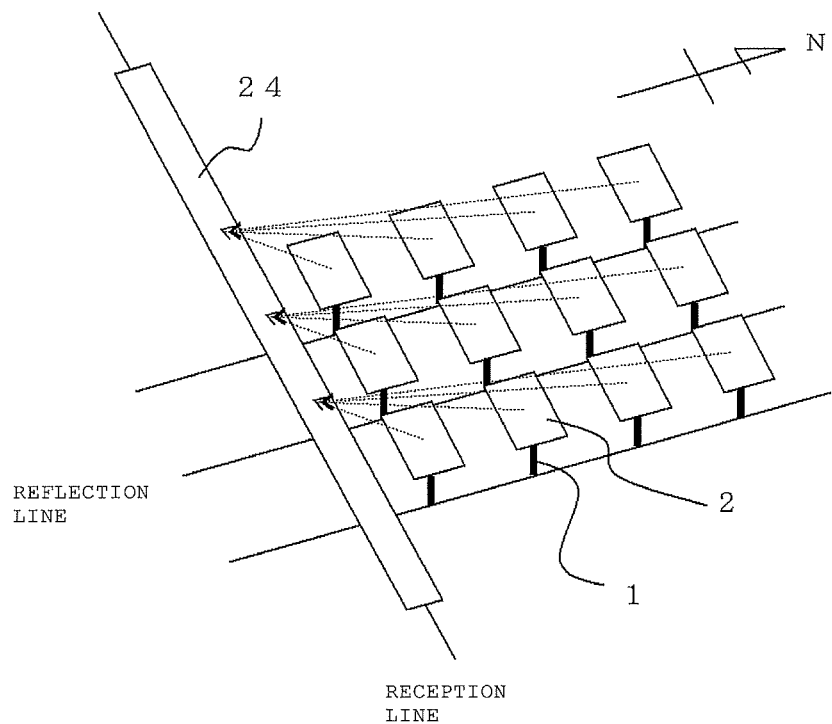
FIG. 9 is a schematic diagram of an example of a solar heat collecting apparatus.

FIG. 9 depicts an example of a solar heat collecting apparatus. This solar heat collecting apparatus 23 is a cross linear type, with plural reflection lines (in the north-south direction) and one or more reception lines (in the east-west direction). One or more heliostats 1 is positioned on each of the reflection lines. One or more receivers 24 are positioned on the reception lines.

Solar heat can be collected by collecting in a receiver 24 the sunlight reflected by the reflecting mirrors 2, the angle of which has been adjusted by the heliostats 1 on the reflection lines. The heat collected by the receiver 24 is used to heat a medium that is sent to a steam turbine or gas turbine, etc. (not pictured) to generate electricity.

Figure 10:
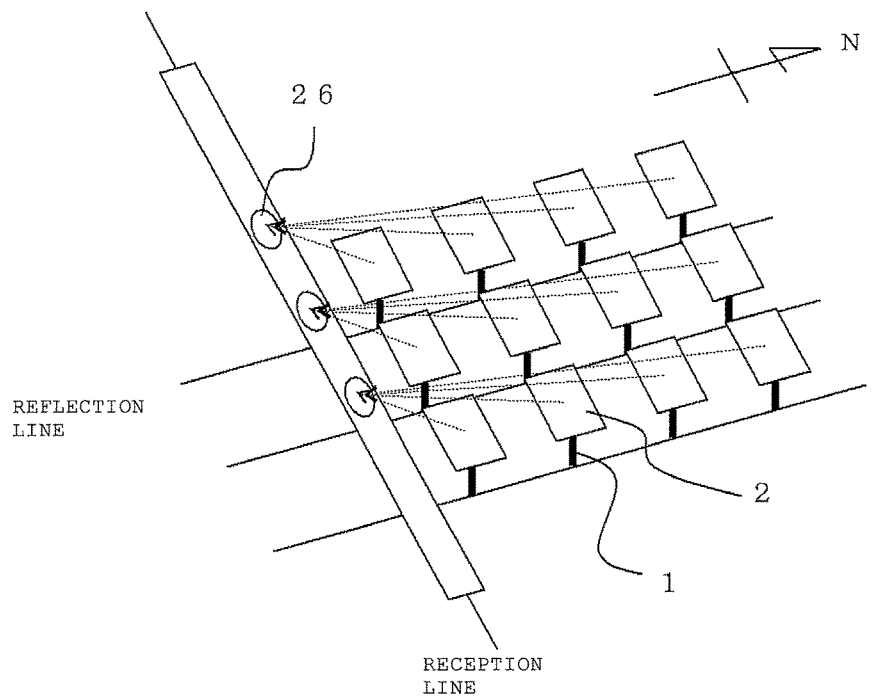
FIG. 10 is a schematic diagram of an example of a concentrating photovoltaic apparatus.

FIG. 10 is an example of a concentrating photovoltaic apparatus. The cross linear concentrating photovoltaic apparatus 25 has one or more heliostats 1 positioned on plural reflection lines, and photovoltaic cells 26 supported by receivers positioned on one or more reception lines.

Electricity can be generated by collecting in the photovoltaic cells 26 the sunlight reflected by the reflecting mirrors 2, the angle of which has been adjusted by the heliostats 1.

FIGS. 9 and 10 illustrate cross linear type apparatuses, but the present invention is not limited to this configuration, and it is also possible to use the heliostat 1 of the present invention with tower type systems, for example.

Figure 22:
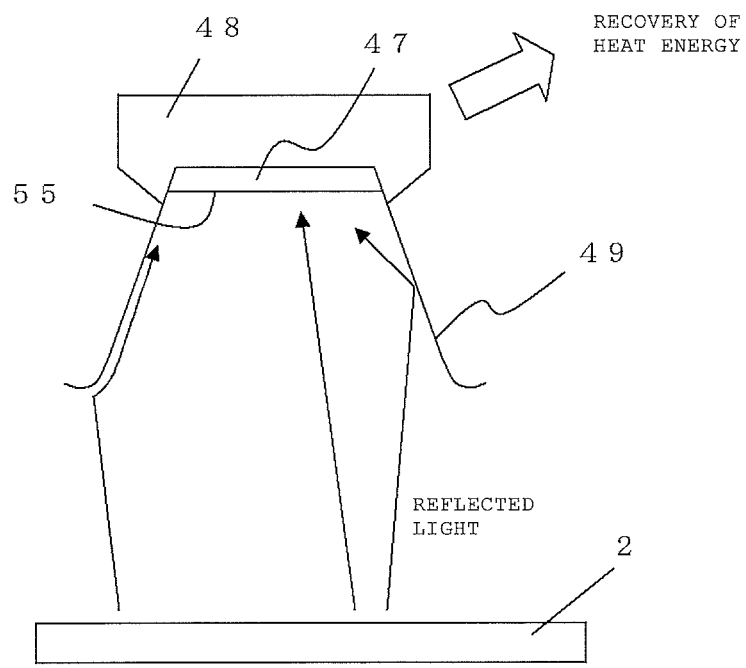
FIG. 22 is an explanatory diagram of an example of the peripheral structure of a photovoltaic cell.

Regarding apparatuses that collect light in photovoltaic cells as illustrated in FIGS. 10 and 17, an example of the peripheral structure of the photovoltaic cell is described as follows, with reference to FIG. 22.

In this example, the photovoltaic cell 47 is equipped with a heat exchanger 48 and a secondary light collector 49.

The temperature of a photovoltaic cell increases as a result of collecting reflected light, and the heat exchanger 48 can limit the loss of electricity generation efficiency in the photovoltaic cell resulting from the increase in temperature. There are no particular requirements as to the heat exchanger itself. Heat exchangers that use various mediums (gas, fluid, etc.), for example, can be used. This is preferable in that not only can electric energy be garnered from the photovoltaic cell, but heat energy can also be recovered from the heat exchanger 48.

There are also no particular requirements as to the form and materials, etc. of the secondary light collector 49 as long as it is positioned at the photovoltaic cell 47 and collects reflected light on the photoreceiving surface 55 of the photovoltaic cell 47. Even if the reflected light is reflected away from the photovoltaic cell itself, if it is reflected toward the inside of the secondary light collector it can be collected in the photovoltaic cell. This increases the range of light collection (the reflection tolerance), and is convenient in that it allows the accuracy of the reflecting angle of the reflecting mirror to be relaxed. Light can be collected efficiently.

Regarding the shape of the secondary light collector, a tubular form can be considered. For example, the photovoltaic cell can be positioned at the narrow end of a cone or pyramid. At the side opposite the photovoltaic cell, i.e., at the reflected light entrance, there can be, for example, a rolled rim in a trumpet shape, as depicted in FIG. 22. This would make it easy for light reflected toward the rim to enter the secondary light collector (i.e., to move toward the photovoltaic cell), for efficient light collection. Naturally, the secondary light collector is not limited to this configuration with this rim.

The material can be aluminum, for example, and the surface can be treated with an oxide film. Using aluminum as the material reduces weight, making it easy to transport. This is preferable when, as in FIG. 17, the photovoltaic cell support is part of an integrated unit with the reflecting mirror and mirror frame, etc. (in which case the secondary light collector is also part of the integrated unit), as the weight of the secondary light collector will not easily overload the rotation of the integrated unit.

Another example of a concentrating photovoltaic apparatus is described as follows, with reference to FIG. 23.

In the heliostat apparatus of this concentrating photovoltaic apparatus, a light collection receiver 50 is fixed on the mirror frame 3. A photovoltaic cell 51 is positioned inside the light collection receiver 50 and collects light reflected by the reflecting mirror 2. A sensor 52 is positioned on the outside of the light collection receiver 50.

There are no particular requirements as to the form of the mirror frame or the light collection receiver that is affixed to it. However, it is preferable to consider a form that will allow as much sunlight as possible to shine on the reflecting mirror, without being blocked by the light collection receiver.

The sensor 52 senses the light source direction from the rays of the sun. In other words, it can sense the position of the sun from the sun's rays, and transmit a signal regarding the position and direction of the sun. As noted earlier, the sensor 52 is connected to the mechanism for controlling the east-west and north-south angles of the reflecting mirror, etc. The system is programmed to automatically adjust the angle of the reflecting mirror, etc. by the various mechanisms to follow the movement of the sun, based on the signals regarding the position of the sun transmitted by the sensor 52. In the example in FIG. 23, the sensor 52 is set at the top of the light collection receiver 50, and follows the sun as it rises, such that the photovoltaic cell, the sensor, and the sun are always aligned over the normal vector of the reflecting surface.

There is no particular requirement as to the position of the sensor 52, as long as it is positioned so that it can easily receive sunlight.

The photovoltaic cell 51 is also connected with the mechanisms controlling the angle of the reflecting mirror, etc., and a portion of the energy generated by the photovoltaic cell 51 by collecting reflected light can be used to drive the various mechanisms. For example, in the mechanism depicted in FIG. 1, the rotation of the reflecting mirror, etc. can be controlled with a relatively small amount of electric power, such that a portion of the power generated by the photovoltaic cell 51 would be sufficient for the controls.

By equipping the system with a photovoltaic cell 51 and a sensor 52, it is possible to automatically drive and control the angle of the reflecting mirror, etc., throughout the day. Even without a central control-type of computer to calculate the position of the sun and relay the information to the various mechanisms, the system can be easily automatically controlled. As there is no need for central controls, this can be a self-contained apparatus, saving space and the cost of cables, etc., to connect to the central controls.

With this sort of apparatus, the use of the sensor 52 throughout the day makes it possible to automatically follow the movement of the sun. Accordingly, when the sun sets, the reflecting surface of the reflecting mirror 2 and the sensor 52 will face west. In this position, after the sun sets and even after it rises in the east the next morning, the photovoltaic cell 51, the reflecting surface of the reflecting mirror and the sensor 52 will be in the shadow of the reflecting mirror 2 and will not be exposed to sunlight, so that the automatic adjustment of the angle of the reflecting mirror, etc. is not possible. For this reason, the apparatus should be equipped with an auxiliary photovoltaic cell that in the evening or the following morning will automatically rotate and adjust the angle of the reflecting mirror, etc. that was facing west the previous evening to the east.

The presence of the auxiliary photovoltaic cell is also effective on cloudy days, when the sensor 52 can't capture the location of the sun (i.e., when the sensor 52 loses sight of the sun and can't transmit signals regarding the position of the sun).

Figure 24:
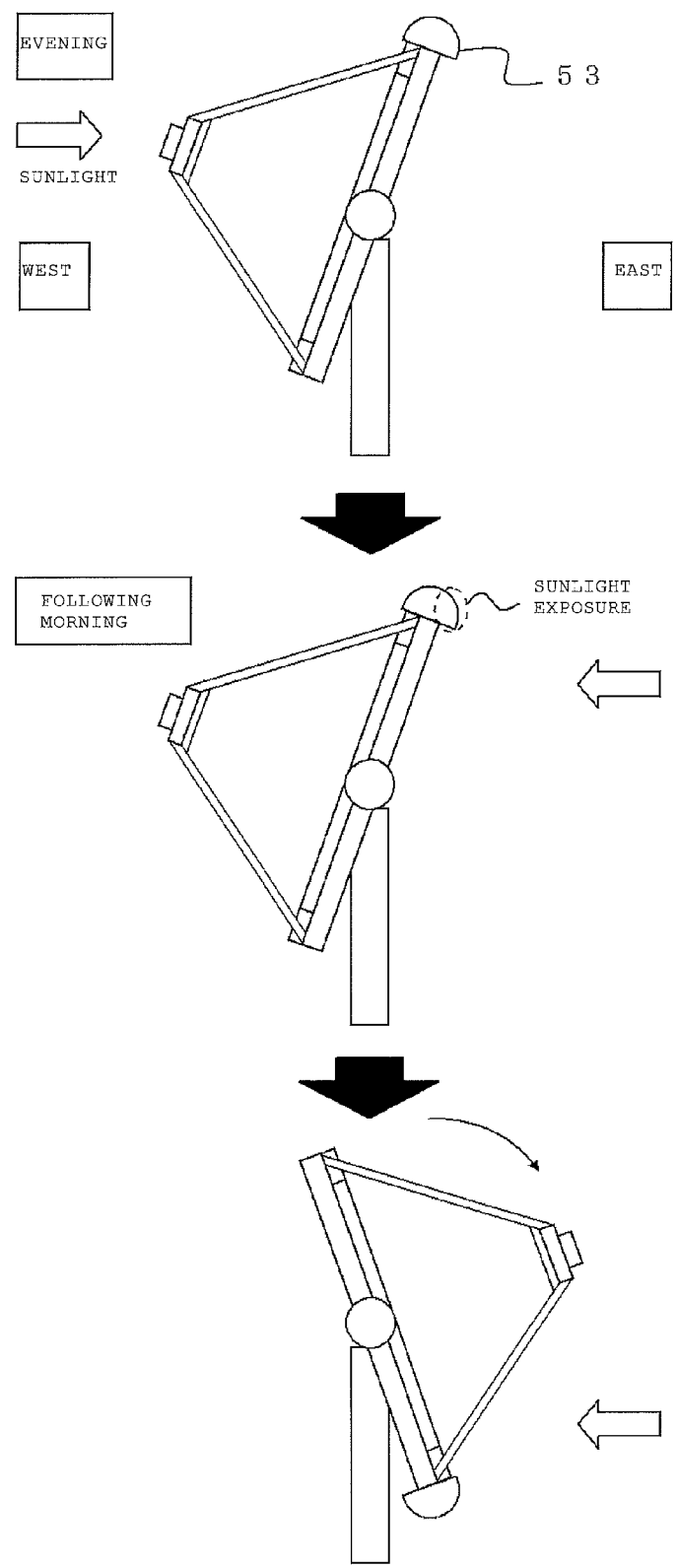
FIG. 24 is an explanatory diagram of an example of an apparatus with an auxiliary photovoltaic cell.

FIG. 24 depicts an example that includes an auxiliary photovoltaic cell. The auxiliary photovoltaic cell generates electricity on exposure to the morning sunlight, and can use that power to drive the rotation of the reflecting surface of the reflecting mirror to the east. Regarding the form and placement of the auxiliary photovoltaic cell 53, a hemispherical one can be placed at the end of the mirror frame, for example. Of course, it is not limited to this configuration, and it can be any shape and placed in any way that allows it to easily be exposed to sunlight in the morning, and after clouds dissipate. For example, a curved-plate one could be used, or it may be placed on the back of the reflecting mirror, or on the support.

Figure 25:
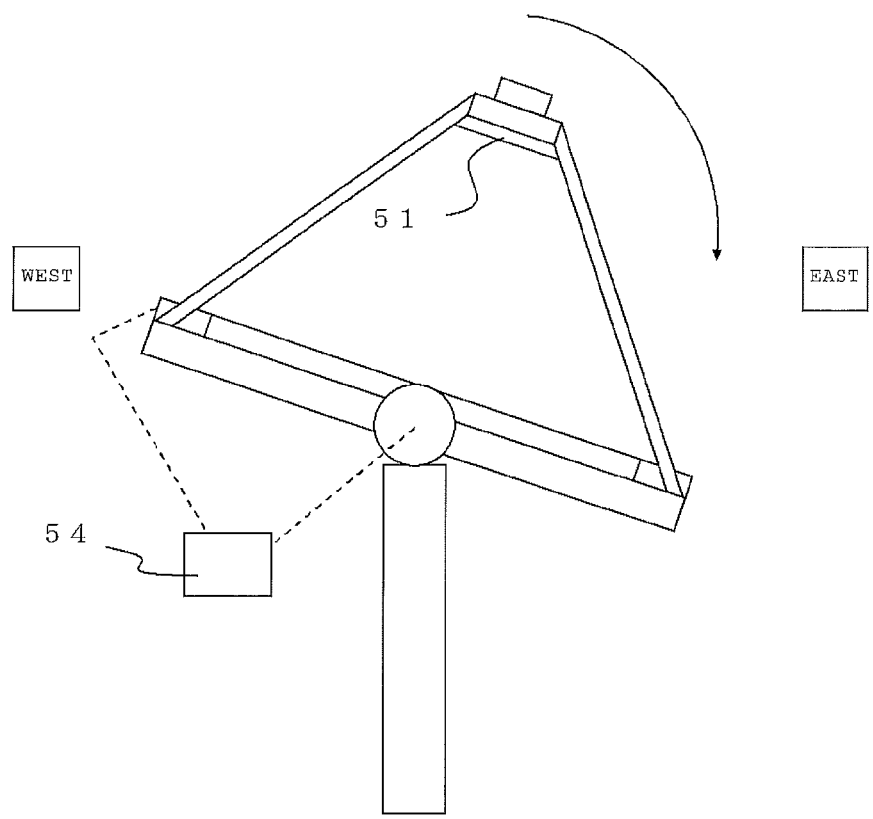
FIG. 25 is an explanatory diagram of an example of an apparatus with an auxiliary storage battery.

Instead of an auxiliary photovoltaic cell, it is also possible to equip the system with an auxiliary storage battery 54, as depicted in FIG. 25. It would only need to rotate the reflecting mirror, etc., once a day, or a few times in cloudy weather, so a low capacity storage battery is sufficient. It is also possible to use a storage battery that can be charged using a portion of the power produced by the photovoltaic cell 51.

With this sort of assembly, the angle of the reflecting surface of the reflecting mirror can be adjusted overnight to face east.

By equipping the system with these sorts of auxiliary mechanisms, the system can stand alone to a greater degree. It is possible to determine the equipment to use on the basis of cost and sun conditions at the installation location, etc.

Figure 36:
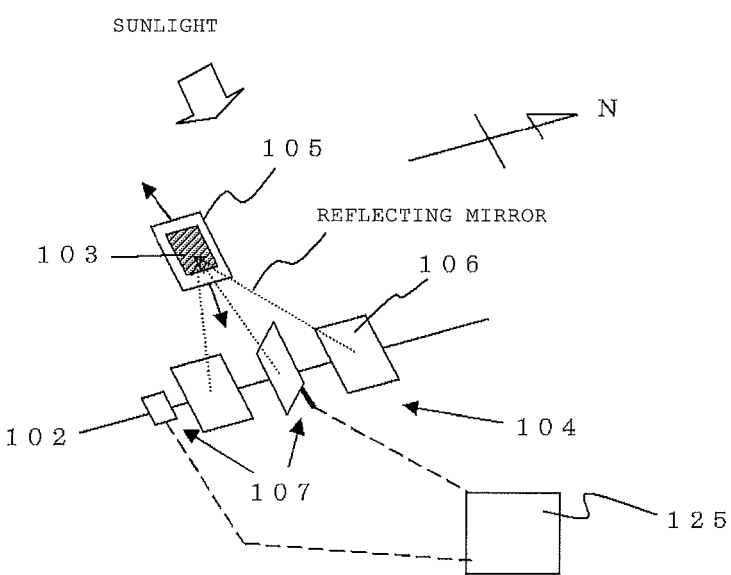
FIG. 36 is a schematic diagram of another example of the concentrating photovoltaic apparatus of the present invention.

FIG. 36 is another example of a concentrating photovoltaic apparatus of the present invention. Here it is depicted with one reflection line and one receiver, but the receiver is not limited to one unit, and plural receivers can be used.

The overall configuration of the concentrating photovoltaic apparatus 101 is as follows. There is a single reflection line 102, over which plural reflecting mirrors 104 are installed. The system is equipped with a single receiver 105. The receiver 105 can be rotated in an arc in the east-west direction with the reflection line 102 as the central axis using the receiver rotation mechanism. Sunlight is reflected by the reflecting mirrors 104, and the reflected light is collected by the receiver 105 to collect sunlight.

A photovoltaic cell 103 is positioned on the receiver 105, and sunlight is collected on its photoreceiving surface to generate electricity.

Figure 35:
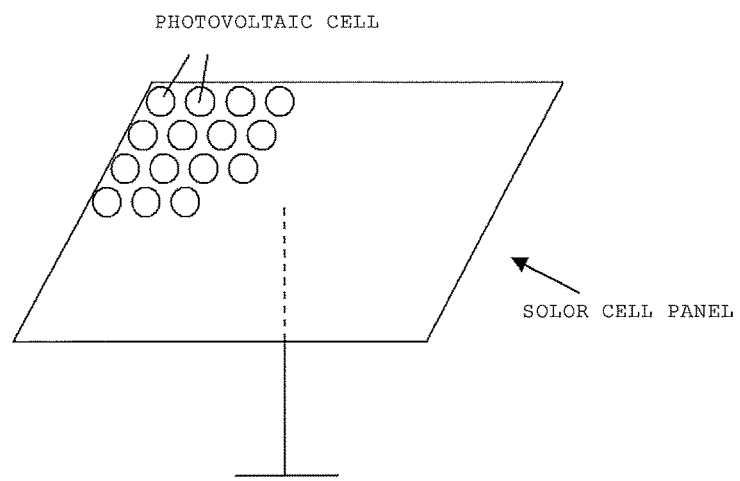
FIG. 35 is a schematic diagram of an example of an conventional electricity generating apparatus using photovoltaic cells.

By placing a photovoltaic cell at the point where the sunlight has been collected by the reflecting mirrors, it is possible to generate electricity more easily and efficiently, and at much lower cost than the conventional method illustrated in FIG. 35. Rather than installing numerous panels equipped with multiple photovoltaic cells, installing low cost reflecting mirrors and collected light in the receiver's photovoltaic cell makes it possible to achieve high efficiency, low cost power generation.

Unlike a conventional solar heat collecting apparatus, this system includes a photovoltaic cell, so that large-scale equipment such as a turbine is not required. For this reason, the cost of the system is lower. The land needed to install a turbine also becomes unnecessary.

Each component is described as follows.
(Reflecting Mirrors)

The plural reflecting mirrors 104 are described as follows. There are no particular requirements as to the shape, etc. of the reflecting mirrors 104, as long as there is a reflecting surface 106 to reflect sunlight. For example, the sunlight reflecting surface 106 can be flat, or it can be concave. There are no particular requirements as to size, and a mirror with a reflecting surface 106 of about 60 cm×60 cm in area, for example, can be used.

The plural reflecting mirrors 104 are installed on the reflection line 102. FIG. 36 shows three reflecting mirrors installed, but there is no particular requirement as to the number. For example, the number can be increased or decreased in accordance with the amount of space available for the installation.

The reflecting mirrors 104 are equipped with a heliostat mechanism 107 that includes an east-west angle adjustment unit and a north-south angle adjustment unit.

The reflecting mirrors 104, the heliostat mechanism 107 (east-west angle adjustment unit and north-south angle adjustment unit), the receiver 105, and the receiver rotation mechanism, etc., can all be configured as described earlier herein.

For example, the reflecting mirrors 104 can be a single flat or concave mirror, or they can be made up of a mosaic surface as illustrated in FIG. 29. It is also possible to use plural mirrors, as illustrated in FIG. 7.

The heliostat mechanism 107 with an east-west angle adjustment unit and a north-south angle adjustment unit includes the type of heliostat apparatus illustrated in FIG. 1. As described earlier, the east-west and north-south angles of the reflecting surface of the reflecting mirrors can be adjusted by rotating with the east-west rotational shaft or the north-south rotational shaft as the rotational axis. In other words, the east-west rotational shaft, etc., fulfills the role of east-west angle adjustment unit, and the north-south rotational shaft, etc., fulfills the role of north-south angle adjustment unit.

Figure 23:
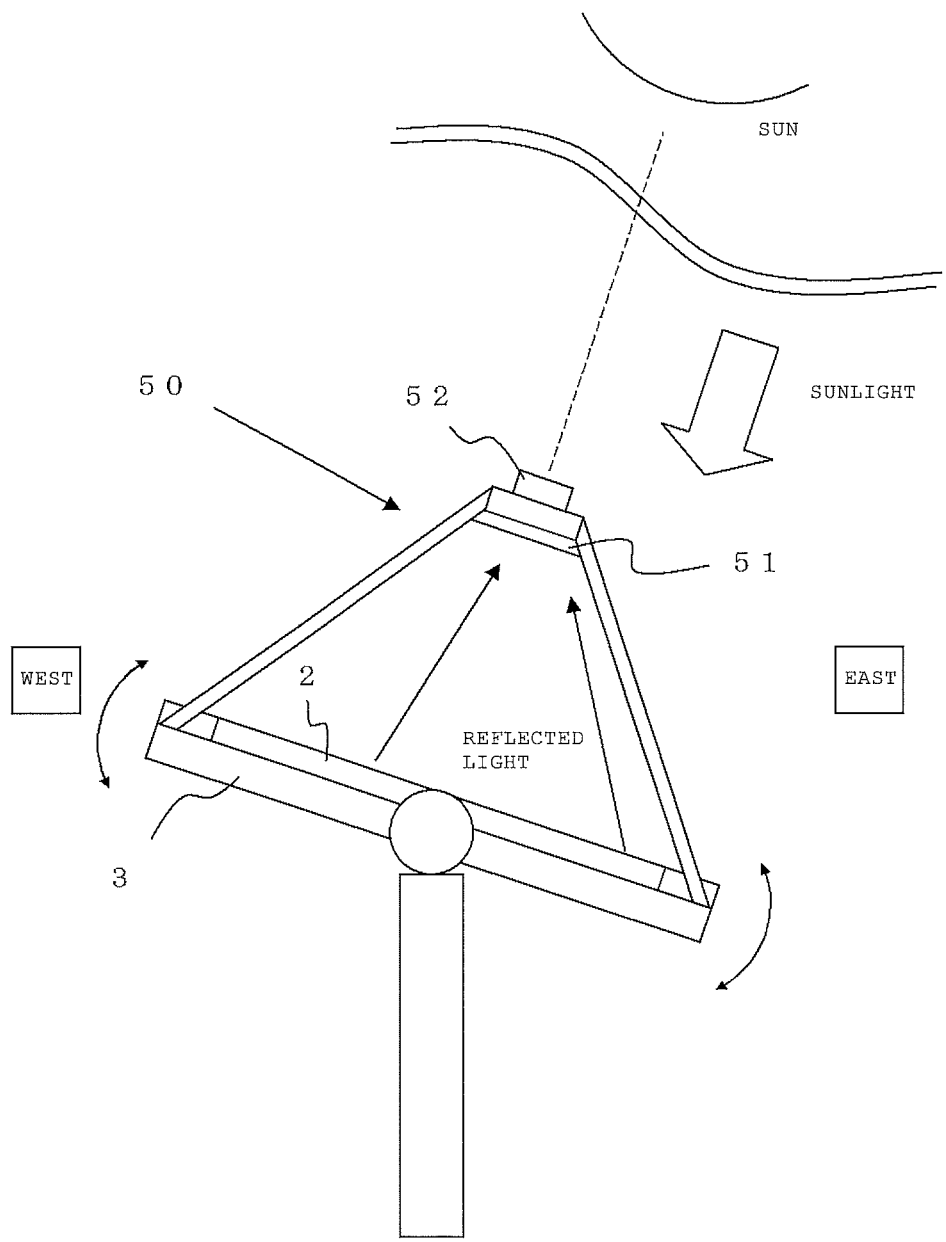
FIG. 23 is a schematic diagram of another example of the concentrating photovoltaic apparatus.

The receiver 105 can be separate from the heliostat apparatus as illustrated in FIG. 10, or it can be a light collection receiver that is fixed to the mirror frame as illustrated in FIG. 23.

The receiver rotation mechanism can be a separate mechanism for rotating the receiver in the east-west direction when the receiver is separate from the heliostat apparatus as in FIG. 10. When the receiver is fixed to the mirror frame (the heliostat apparatus) as in FIG. 23, the east-west rotational shaft, etc., of the heliostat apparatus will function as the receiver rotation mechanism.

The angle of the reflecting surface 106 must not only be freely adjustable, but as a heliostat mechanism 107, it must actually adjust angles to follow the movement of the sun.

To carry out these angle adjustments smoothly, angle adjustment data for each reflecting mirror 104 relative to the movement of the sun according to the calendar and true solar time should be incorporated internally in the east-west angle adjustment unit and the north-south angle adjustment unit.

It is also possible to control the east-west angle adjustment unit and the north-south angle adjustment unit as in conventional systems, by continually calculating the position of the sun, and then calculating the angle of the reflecting surfaces relative to the position of the sun. However, by using internal data patterns as described above, it is not necessary to continually perform calculations, as in conventional systems, and the angle adjustment of the reflecting surfaces doesn't depend on these continual calculations, so it is possible to make the adjustments without falling behind the movement of the sun, and the system is simpler and more accurate. This also leads to greater light collection efficiency. This aspect can be determined as appropriate on the basis of cost, etc.

The east-west angle adjustment unit and the north-south angle adjustment unit can be independently controlled, but this is not a particular requirement, and it is also possible to equip the system with a central control unit 125 as illustrated in FIG. 36, connect it to the east-west angle adjustment unit and the north-south angle adjustment unit, and control these in a unified manner. For example, the central control unit 125 can be used to control the initial angle adjustment of the reflecting surface of the start of light collection, or during maintenance. The initial angle of the reflecting surface 106 can be adjusted by the central control unit 106 on the basis of the results of calculation of the appropriate angle of the reflecting surface 106 according to the position of the sun, and calculation of angle adjustment control data.

After adjusting to the initial angle, the central control unit 125 can continue to make angle adjustments, or angles can be adjusted by the internal data as described above.

(Efficacy of Receiver Rotation)

The efficacy of rotating the receiver in the east-west direction to follow the movement of the sun is described by comparing the differences in the collected light image of the reflected light from a reflecting mirror with a receiver placed in a fixed position and a receiver that rotates (for ease of explanation, the reflecting surface in this example will be concave, and the sun's rays will reach the reflecting mirror at a perpendicular angle and be collected at one spot).

FIG. 38 shows a collected light image for a receiver that is placed in a fixed position facing south. Sunrise (east) and meridian passage (south) are shown. Within the rotational surface of the reflecting mirror in the east-west direction, at the time of meridian passage, the sun, the receiver, and the reflecting mirror are aligned in a straight line, and because the sun's rays hit the reflecting surface of the reflecting mirror at a perpendicular angle, the reflected light is efficiently collected in the receiver. In contrast, at sunrise, the sun's rays hit the reflecting mirror at an angle that is not perpendicular, creating differences in the angle of reflection at either edge of the reflecting surface, and causing the collected light image to spread as reflected light is not collected in the receiver. The greater the difference between the position of the sun and the position of the receiver (for example, in the morning and evening), the collected light image spreads, and the light collection efficiency falls.

Figure 37:
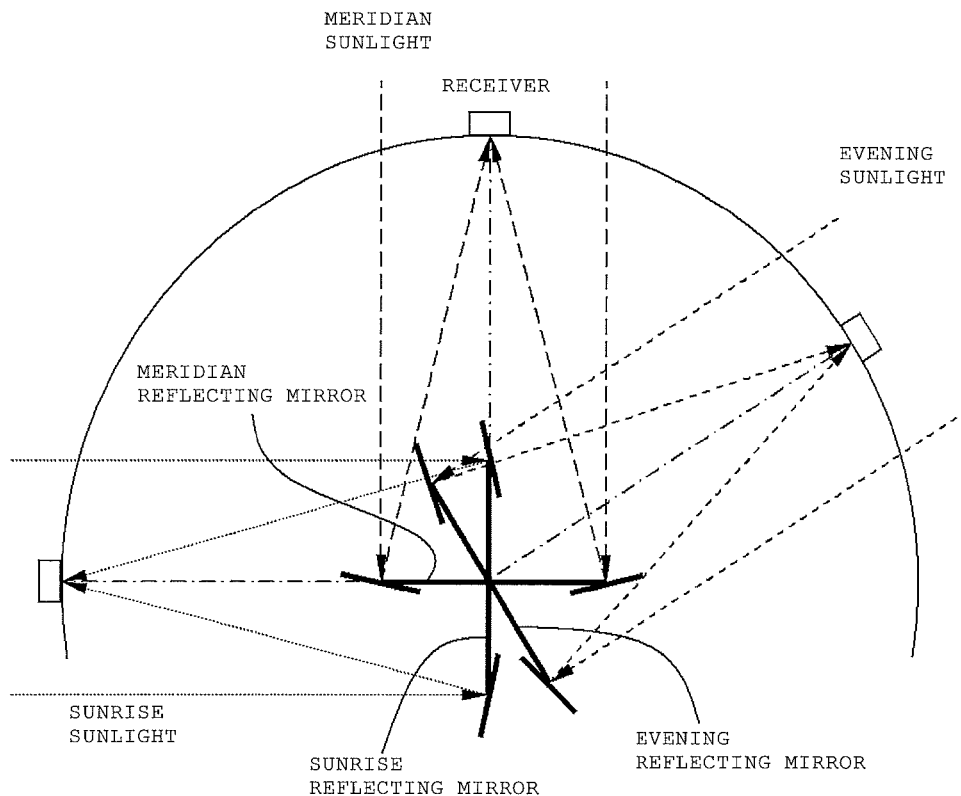
FIG. 37 is an explanatory diagram of the collected light image when the receiver is rotated in the east-west direction.

FIG. 37 shows a collected light image for a receiver that rotates in the east-west direction. In order to make the efficacy of the rotating receiver clear, the angle of the reflecting surface of the reflecting mirror in the east-west direction, and the rotation angle of the rotating receiver in the east-west direction are adjusted by the east-west angle adjustment unit and the receiver rotation mechanism to match the azimuth angle of the sun.

At meridian passage, this is the same as FIG. 38. In the morning (including sunrise), within the rotational surface of the reflecting mirror in the east-west direction, as the sun, the receiver and the reflecting mirror are still aligned in a straight line, the rays of the sun hit the reflecting mirror at a perpendicular angle, such that it is possible to achieve the same high light collection efficiency as at meridian passage. The situation is the same in the evening. Accordingly, it is possible to avoid blurring of the focal point throughout the day, and to stably and uniformly collect light with high efficiency. In other words, it is possible to obtain even more light energy.

In this way, it is clear that rotating the receiver in the east-west direction is extremely effective for collecting sunlight.

The concentrating photovoltaic apparatus 101 of the present invention is equipped with the receiver rotation mechanism as noted above, and because the receiver 105 can be rotated in an arc with the reflection line as the central axis, in the east-west direction to follow the movement of the sun, it is possible to collect light more efficiently than the system illustrated in FIG. 38, with a fixed-position receiver. With the receiver 105 rotating to follow the movement of the sun, even if the angle of the reflecting surface 106 of the reflecting mirror 104 and the rotational angle of the receiver 105 in the east-west direction are adjusted to differ from the position of the sun, it is still possible to see sufficient improvement in the light collection efficiency. However, it is preferable to adjust to match the azimuth angle of the sun, in order to garner more light energy.

Like the heliostat mechanism 107, the receiver rotation mechanism can be controlled by the internal data, or by the central control unit 125.

The present invention is not limited to the above embodiments. These embodiments are merely illustrative, and any other configuration that is substantially the same as and provides the same benefits as the technological ideas described in the claims of the present invention is included in the technical scope of the present invention.

What is claimed is:

1. A heliostat apparatus that adjusts an angle of a reflecting surface of at least one reflecting mirror to follow the movement of the sun, the heliostat apparatus comprising:
   one mirror frame to support the at least one reflecting mirror; a pair of north-south rotational shafts whose rotational axial direction is the east-west direction for the purpose of rotating the mirror frame in the north-south direction, the pair of the north-south rotational shafts being connected to the mirror frame; an east-west rotational shaft whose rotational axial direction is the north-south direction for the purpose of rotating the mirror frame in the east-west direction; a pair of arms projecting from the east-west rotational shaft to the east and the west; and a support that supports the east-west rotational shaft and allows the axial rotation of the east-west rotational shaft, wherein,
   the pair of the north-south rotational shafts, capable of axial rotation, is positioned on the ends of the pair of the arms such that the north-south rotational shafts face each other;
   with the east-west rotational shaft as the rotational axis, the pair of the arms, the pair of the north-south rotational shafts, and the mirror frame are rotated as an integrated unit in the east-west direction, such that the angle of the reflecting surface of the at least one reflecting mirror supported by the mirror frame is adjusted in the east-west direction; and,
   with the pair of the north-south rotational shafts as the rotational axis, the mirror frame is rotated in the north-south direction such that the angle of the reflecting surface of the at least one reflecting mirror is adjusted in the north-south direction.

2. The heliostat apparatus according to claim 1, further comprising a motor that is connected to the east-west rotational shaft and controls the axial rotation of the east-west rotational shaft.

3. The heliostat apparatus according to claim 1, further comprising an east-west chain attached at the ends of the pair of the arms and an east-west chain length adjusting unit to which the east-west chain is hooked, wherein,
   by operation of the east-west chain length adjusting unit, the pair of the arms and the mirror frame are integrally rotated in the east-west direction with the east-west rotational shaft as the rotational axis, as a length of the east-west chain between the east-west chain length adjusting unit and the location of the arms at which the east-west chain is attached is adjusted.

4. The heliostat apparatus according to claim 1, further comprising a north-south chain attached at the mirror frame from north to south, and a north-south chain length adjusting unit to which the north-south chain is hooked, wherein,
by operation of the north-south chain length adjusting unit, the mirror frame are rotated in the north-south direction with the north-south rotational shafts as the rotational axis, as a length of the north-south chain between the north-south chain length adjusting unit and the location of the mirror frame at which the north-south chain is attached is adjusted.

5. The heliostat apparatus according to claim 3, further comprising a structure in order to hold a shape of the mirror frame.

6. The heliostat apparatus according to claim 4, further comprising a structure in order to hold a shape of the mirror frame.

7. The heliostat apparatus according to claim 1, wherein the mirror frame has a quadrangular frame and a rear support member, and
one reflecting mirror is positioned on each side of the quadrangular frame such that it is tilted toward the inside of the quadrangular frame, and the rear support member supports the back of the tilted reflecting mirrors.

8. The heliostat apparatus according to claim 1, wherein the reflecting surface of each reflecting mirror is a Fresnel surface.

9. The heliostat apparatus according to claim 1, wherein each reflecting mirror has a base and plural reflecting mirror pieces with a flat shape fitted upon the base;
the reflecting surface of each reflecting mirror is a mosaic surface made up of aggregate reflecting surfaces of the plural reflecting mirror pieces, and the reflected sunlight from the reflecting surface of each of the plural reflecting mirror pieces overlaps to form a focal point; and,
the plural reflecting mirror pieces are mounted on mounting surfaces of the base and an angle of each mounting surface is adjusted such that the reflected sunlight from the reflecting surfaces of the plural reflecting mirror pieces fitted on the base is collected at the focal point.

10. The heliostat apparatus according to claim 9, wherein the focal point is polygonal in shape.

11. The heliostat apparatus according to claim 9, wherein each mounting surface is connected to an adjacent mounting surface by a step, and
a step surface of the step that connects the adjacent mounting surfaces to each other has a hole that passes through the base.

12. A solar heat collecting apparatus, wherein the solar heat collecting apparatus includes one or more heliostat apparatuses according to claim 1, and the reflected sunlight from the at least one reflecting mirror supported by each heliostat apparatus, in which the angle of the reflecting surface is adjusted, is collected in a receiver to collect solar heat.

13. A concentrating photovoltaic apparatus, wherein the concentrating photovoltaic apparatus includes one or more heliostat apparatuses according to claim 1, and the reflected light of the sunlight from the at least one reflecting mirror supported by each heliostat apparatus, in which the angle of the reflecting surface is adjusted, is collected in a photovoltaic cell.

14. The concentrating photovoltaic apparatus according to claim 13, wherein the photovoltaic cell is equipped with a heat exchanger.

15. The concentrating photovoltaic apparatus according to claim 13, wherein the photovoltaic cell is equipped with a tubular secondary light collector to guide the reflected light that is collected by the at least one reflecting mirror to the photoreceiving surface of the photovoltaic cell.

16. The concentrating photovoltaic apparatus according to claim 13, wherein the heliostat apparatus is equipped with a light collection receiver supported by the mirror frame; the light collection receiver includes the photovoltaic cell and a sensor that senses the position of the sun from the sunlight and transmits a signal; and,
based on the signal transmitted by the sensor, the angle of the reflecting surface of the at least one reflecting mirror can be automatically adjusted in the north-south and east-west directions to follow the movement of the sun by controlling the east-west rotation of the integrated unit including the pair of the arms, the pair of the north-south rotational shafts and the mirror frame, and controlling the north-south rotation of the mirror frame, powered by the photovoltaic cell.

17. The concentrating photovoltaic apparatus according to claim 16, wherein the heliostat apparatus is further equipped with an auxiliary storage battery or an auxiliary photovoltaic cell, and
using power from the auxiliary storage battery or auxiliary photovoltaic cell, the reflecting surface of the at least one reflecting mirror can be automatically adjusted to face the east after nightfall before the following sunrise by rotating the integrated unit including the pair of the arms, the pair of the north-south rotational shafts, and the mirror frame from west to east.

18. The concentrating photovoltaic apparatus according to claim 13, wherein the concentrating photovoltaic apparatus includes a reflection line and one or more receivers;
the reflection line is arranged in a north-south direction; plural reflecting mirrors to reflect sunlight are installed in series on the reflection line; the plural reflecting mirrors are provided with a heliostat mechanism to adjust the angle of the reflecting surface of the plural reflecting mirrors to follow the movement of the sun;
the heliostat mechanism includes an east-west angle adjustment unit to be capable of adjusting the angle of the reflecting surface of the plural reflecting mirrors in the east-west direction, and a north-south angle adjustment unit to be capable of separately adjusting the angle of the reflecting surface of the plural reflecting mirrors in the north-south direction;
the one or more receivers are each equipped with a receiver rotation mechanism that rotates the receiver to follow the movement of the sun in an east-west arc with the reflection line as the central axis; and, the receiver is equipped with a photovoltaic cell, the photoreceiving surface of which collects the reflected sunlight from the plural reflecting mirrors.

19. The concentrating photovoltaic apparatus according to claim 18, wherein the east-west angle adjustment unit and the receiver rotation mechanism adjust the angle of the reflecting surface of the plural reflecting mirrors in the east-west direction, and the rotational angle of the rotating receiver in the east-west direction, respectively, in order to match the azimuth angle of the sun.

* * * * *